(12) United States Patent
Kim et al.

(10) Patent No.: US 12,099,423 B2
(45) Date of Patent: Sep. 24, 2024

(54) METHOD FOR PREVENTING MALFUNCTION OF CONNECTOR AND ELECTRONIC DEVICE HAVING CONNECTOR

(71) Applicant: Samsung Electronics Co., Ltd., Suwon-si (KR)

(72) Inventors: Hakyoung Kim, Suwon-si (KR); Kyoungwon Kim, Suwon-si (KR); Wookwang Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 105 days.

(21) Appl. No.: 17/877,209

(22) Filed: Jul. 29, 2022

(65) Prior Publication Data

US 2023/0061469 A1    Mar. 2, 2023

Related U.S. Application Data

(63) Continuation of application No. PCT/KR2022/010244, filed on Jul. 13, 2022.

(30) Foreign Application Priority Data

Aug. 10, 2021    (KR) .................. 10-2021-0105636

(51) Int. Cl.
*G06F 11/26*    (2006.01)
*G06F 1/26*     (2006.01)
(Continued)

(52) U.S. Cl.
CPC .............. *G06F 11/26* (2013.01); *G06F 1/266* (2013.01); *G06F 1/28* (2013.01); *G06F 1/30* (2013.01)

(58) Field of Classification Search
CPC ............ G06F 11/26; G06F 1/266; G06F 1/28; G06F 1/30
See application file for complete search history.

(56) References Cited

U.S. PATENT DOCUMENTS

| | | | | |
|---|---|---|---|---|
| 6,523,073 | B1 * | 2/2003 | Kammer | ............... G06F 1/3209 710/48 |
| 11,169,584 | B2 * | 11/2021 | Peter | ....................... G06F 1/266 |
| 2010/0100200 | A1 | 4/2010 | Kim et al. | |

(Continued)

FOREIGN PATENT DOCUMENTS

| | | |
|---|---|---|
| EP | 2 930 588 A1 | 10/2015 |
| EP | 3 506 051 A1 | 7/2019 |

(Continued)

OTHER PUBLICATIONS

International Search Report dated Oct. 21, 2022, issued in International Application No. PCT/KR2022/010244.

(Continued)

*Primary Examiner* — Farley Abad
*Assistant Examiner* — Richard B Franklin
(74) *Attorney, Agent, or Firm* — Jefferson IP Law, LLP

(57) ABSTRACT

An electronic device is provided. The electronic device includes a connector including one or more signal terminals and a control circuit electrically connected with the one or more signal terminals. The control circuit may be configured to monitor attachment with an external device through an identification terminal among the one or more signal terminals, identify whether a designated number of, or more, monitoring signals related to attachment with the external device are detected during a designated time, and identify whether there is the attachment with the external device, based on a voltage of a power terminal among the one or more signal terminals, in response to the detection of the monitoring signals being identified.

20 Claims, 11 Drawing Sheets

(51) Int. Cl.
*G06F 1/28* (2006.01)
*G06F 1/30* (2006.01)

(56) References Cited

U.S. PATENT DOCUMENTS

| | | |
|---|---|---|
| 2014/0006652 A1 | 1/2014 | Chen et al. |
| 2017/0374487 A1 | 12/2017 | La et al. |
| 2018/0018934 A1 | 1/2018 | Lim et al. |
| 2018/0113832 A1 | 4/2018 | Baek et al. |
| 2020/0004308 A1 | 1/2020 | Moritomo et al. |
| 2020/0403433 A1 | 12/2020 | Chung et al. |

FOREIGN PATENT DOCUMENTS

| | | |
|---|---|---|
| JP | 2001-144772 A | 5/2001 |
| JP | 2003-208396 A | 7/2003 |
| JP | 2007-272376 A | 10/2007 |
| JP | 4112874 B2 | 7/2008 |
| JP | 2017-212165 A | 11/2017 |
| KR | 10-2011-0084945 A | 7/2011 |
| KR | 10-1470364 B1 | 12/2014 |
| KR | 10-2016-0088651 A | 7/2016 |
| KR | 10-2018-0007085 A | 1/2018 |
| KR | 10-2018-0044602 A | 5/2018 |
| KR | 10-2019-0061858 A | 6/2019 |
| KR | 10-2022-0145731 A | 10/2022 |
| WO | 2008/146073 A1 | 12/2008 |

OTHER PUBLICATIONS

European Search Report dated Aug. 9, 2024, issued in European Application No. 22856033.0.

* cited by examiner

METHOD FOR PREVENTING MALFUNCTION OF CONNECTOR AND ELECTRONIC DEVICE HAVING CONNECTOR

CROSS-REFERENCE TO RELATED APPLICATION(S)

This application is a continuation application, claiming priority under § 365(c), of an International application No. PCT/KR2022/010244, filed on Jul. 13, 2022, which is based on and claims the benefit of a Korean patent application number 10-2021-0105636, filed on Aug. 10, 2021, in the Korean Intellectual Property Office, the disclosure of which is incorporated by reference herein in its entirety.

BACKGROUND

1. Field

The disclosure relates to a method for preventing a malfunction of a connector and an electronic device having the connector. More particularly, the disclosure relates to a method for recognizing whether the electronic device is connected through the connector and preventing a malfunction of the connector in the state of being physically connected with the external device.

2. Description of Related Art

An electronic device may connect to various external devices and may receive data from, or transmit data to, an external device. An electronic device may receive power from, or transmit power to, an external device. Such an electronic device may have an interface (e.g., a connector) for connecting with various external devices to provide expanded functionality. An electronic device may include various types of interfacing connectors.

Through a connector used for charging or data input/output, an electronic device may be electrically connected with a charger for charging the electronic device, and the electronic device may supply power to an external device connected with the electronic device. For example, universal serial bus (USB)-type C is a connector for an electronic device, and an electronic device may be connected to an exercise through a USB type-C connector to transmit or receive power or data to/from the external device.

The above information is presented as background information only to assist with an understanding of the disclosure. No determination has been made, and no assertion is made, as to whether any of the above might be applicable as prior art with regard to the disclosure.

SUMMARY

If an electronic device physically connects to an external device through a connector as described above, its role, as a host and/or client, may be determined. For example, it may be determined whether the electronic device operates as a source for supplying power or a sink for receiving power. In this case, the electronic device may identify whether it physically connects with an external device based on the voltage level recognized at an identification terminal of the connector and, in the physically connected state, the electronic device may transmit or receive power.

However, if the electronic device is connected with an external device that fails to meet the regulations defined in the USB power-related standard, despite physical connection of the connector, the voltage level recognized through the identification terminal is excessively changed or attachment (or connection) or detachment (or disconnection) may be repeatedly detected. As such, as an interrupt signal is repeatedly generated due to abnormal changes in connection state, current consumption in the electronic device may increase, so that the electronic device may be discharged.

Accordingly, a need arises for clearly recognizing whether the electronic device is connected through the connector and preventing a malfunction of the connector in the state of being physically connected with the external device.

Aspects of the disclosure are to address at least the above-mentioned problems and/or disadvantages and to provide at least the advantages described below. Accordingly, an aspect of the disclosure is to provide a method for preventing a malfunction of a connector and an electronic device having the connector.

Additional aspects will be set forth in part in the description which follows and, in part, will be apparent from the description, or may be learned by practice of the presented embodiments.

In accordance with an aspect of the disclosure, an electronic device is provided. The electronic device includes a connector including one or more signal terminals and a control circuit electrically connected with the one or more signal terminals. The control circuit may be configured to monitor attachment with an external device through an identification terminal among the one or more signal terminals, identify whether a designated number of, or more, monitoring signals related to attachment with the external device are detected during a designated time, and identify whether there is the attachment with the external device, based on a voltage of a power terminal among the one or more signal terminals, if the detection of the monitoring signals is identified.

In accordance with another aspect of the disclosure, an electronic device is provided. The electronic device includes a connector including one or more signal terminals, a control circuit electrically connected with the one or more signal terminals, and a processor electrically connected with the control circuit. The processor may be configured to monitor attachment with an external device through an identification terminal among the one or more signal terminals, identify whether a designated number of, or more, monitoring signals related to attachment with the external device are detected during a designated time, and in response to the detection of the monitoring signals being identified, allow the control circuit to change a voltage threshold of a power terminal among the one or more signal terminals. The control circuit may be configured to identify whether there is the attachment with the external device, based on a voltage of the power terminal.

In accordance with another aspect of the disclosure, a method for preventing a malfunction of a connector of an electronic device is provided. The method includes monitoring attachment with an external device through an identification terminal among one or more signal terminals included in the connector of the electronic device, identifying whether a designated number of, or more, monitoring signals related to attachment with the external device are detected during a designated time, and identifying whether there is the attachment with the external device, based on a voltage of a power terminal among the one or more signal terminals, in response to the detection of the monitoring signals being identified.

According to various embodiments of the disclosure, it is possible to clearly recognize whether the electronic device is connected through the connector and to prevent a malfunction of the connector in the state of being physically connected with the external device.

According to various embodiments of the disclosure, it is possible to prevent repeated occurrence of an interrupt signal due to changes in connection state and to reduce unnecessary current consumption in the electronic device.

According to various embodiments of the disclosure, although an external device that does not meet the regulations defined in the USB power-related standard is connected to an electronic device, charging or data input/output through a connector may be rendered possible, thus increasing compatibility of USB type-C connection.

According to various embodiments of the disclosure, it is possible to limit unnecessary display of a notification message indicating whether a connection is made whenever an interrupt signal is generated due to a change in connection state and hence prevent the operation of leading the user to check the insertion state of the connector, thereby allowing for more stable use.

Other aspects, advantages, and salient features of the disclosure will become apparent to those skilled in the art from the following detailed description, which, taken in conjunction with the annexed drawings, discloses various embodiments of the disclosure.

BRIEF DESCRIPTION OF THE DRAWINGS

The above and other aspects, features, and advantages of certain embodiments of the disclosure will be more apparent from the following description taken in conjunction with the accompanying drawings, in which.

The same reference numerals are used to represent the same elements throughout the drawings.

DETAILED DESCRIPTION

The following description with reference to the accompanying drawings is provided to assist in a comprehensive understanding of various embodiments of the disclosure as defined by the claims and their equivalents. It includes various specific details to assist in that understanding but these are to be regarded as merely exemplary. Accordingly, those of ordinary skill in the art will recognize that various changes and modifications of the various embodiments described herein can be made without departing from the scope and spirit of the disclosure. In addition, descriptions of well-known functions and constructions may be omitted for clarity and conciseness.

The terms and words used in the following description and claims are not limited to the bibliographical meanings, but, are merely used by the inventor to enable a clear and consistent understanding of the disclosure. Accordingly, it should be apparent to those skilled in the art that the following description of various embodiments of the disclosure is provided for illustration purpose only and not for the purpose of limiting the disclosure as defined by the appended claims and their equivalents.

It is to be understood that the singular forms "a," "an," and "the" include plural referents unless the context clearly dictates otherwise. Thus, for example, reference to "a component surface" includes reference to one or more of such surfaces.

Figure 1:
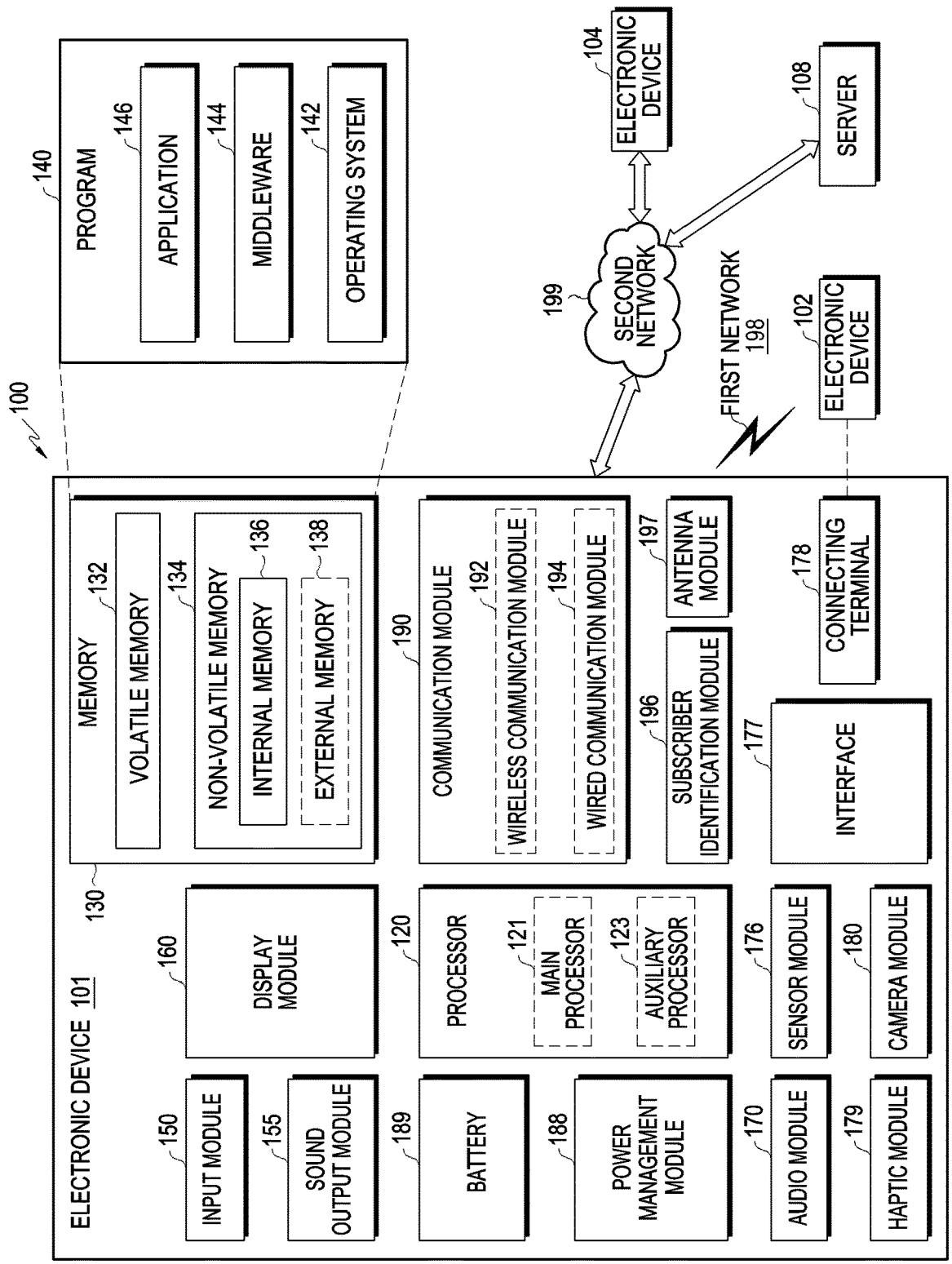
FIG. 1 is a block diagram illustrating an electronic device in a network environment according to an embodiment of the disclosure.

FIG. 1 is a block diagram illustrating an electronic device in a network environment according to an embodiment of the disclosure.

Referring to FIG. 1, an electronic device 101 in a network environment 100 may communicate with an external electronic device 102 via a first network 198 (e.g., a short-range wireless communication network), or at least one of an external electronic device 104 or a server 108 via a second network 199 (e.g., a long-range wireless communication network). According to an embodiment of the disclosure, the electronic device 101 may communicate with the external electronic device 104 via the server 108. According to an embodiment of the disclosure, the electronic device 101 may include a processor 120, a memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In some embodiments of the disclosure, at least one (e.g., the connecting terminal 178) of the components may be omitted from the electronic device 101, or one or more other components may be added in the electronic device 1301. According to an embodiment of the disclosure, some (e.g., the sensor module 176, the camera module 180, or the antenna module 197) of the components may be integrated into a single component (e.g., the display module 160).

The processor 120 may execute, e.g., software (e.g., a program 140) to control at least one other component (e.g., a hardware or software component) of the electronic device 101 connected with the processor 120 and may process or compute various data. According to one embodiment of the disclosure, as at least part of the data processing or computation, the processor 120 may store a command or data received from another component (e.g., the sensor module 176 or the communication module 190) in a volatile memory 132, process the command or the data stored in the volatile memory 132, and store resulting data in a non-volatile memory 134. According to an embodiment of the disclosure, the processor 120 may include a main processor 121 (e.g., a central processing unit (CPU) or an application processor (AP)), or an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. For example, when the electronic device 101 includes the main processor 121 and the auxiliary processor 123, the auxiliary processor 123 may be configured to use lower power than the main processor 121 or to be specified for a designated function. The auxiliary processor 123 may be implemented as separate from, or as part of the main processor 121.

The auxiliary processor 123 may control at least some of functions or states related to at least one (e.g., the display module 160, the sensor module 176, or the communication module 190) of the components of the electronic device 101, instead of the main processor 121 while the main processor 121 is in an inactive (e.g., sleep) state or along with the main processor 121 while the main processor 121 is an active state (e.g., executing an application). According to an embodiment of the disclosure, the auxiliary processor 123 (e.g., an image signal processor or a communication processor) may be implemented as part of another component (e.g., the camera module 180 or the communication module 190) functionally related to the auxiliary processor 123. According to an embodiment of the disclosure, the auxiliary processor 123 (e.g., the neural processing unit) may include a hardware structure specified for artificial intelligence model processing. The artificial intelligence model may be generated via machine learning. Such learning may be performed, e.g., by the electronic device 101 where the artificial intelligence is performed or via a separate server (e.g., the server 108). Learning algorithms may include, but are not limited to, e.g., supervised learning, unsupervised learning, semi-supervised learning, or reinforcement learning. The artificial intelligence model may include a plurality of artificial neural network layers. The artificial neural network may be a deep neural network (DNN), a convolutional neural network (CNN), a recurrent neural network (RNN), a restricted Boltzmann machine (RBM), a deep belief network (DBN), a bidirectional recurrent deep neural network (BRDNN), deep Q-network or a combination of two or more thereof but is not limited thereto. The artificial intelligence model may, additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input module 150 may receive a command or data to be used by other component (e.g., the processor 120) of the electronic device 101, from the outside (e.g., a user) of the electronic device 101. The input module 150 may include, for example, a microphone, a mouse, a keyboard, keys (e.g., buttons), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record. The receiver may be used for receiving incoming calls. According to an embodiment of the disclosure, the receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. According to an embodiment of the disclosure, the display module 160 may include a touch sensor configured to detect a touch, or a pressure sensor configured to measure the intensity of a force generated by the touch.

The audio module 170 may convert a sound into an electrical signal and vice versa. According to an embodiment of the disclosure, the audio module 170 may obtain a sound through the input module 150 or output a sound through the sound output module 155 or an external electronic device (e.g., an external electronic device 102 (e.g., a speaker or a headphone) directly or wirelessly connected with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment of the disclosure, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the external electronic device 102) directly (e.g., wiredly) or wirelessly. According to an embodiment of the disclosure, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the external electronic device 102). According to an embodiment of the disclosure, the connecting terminal 178 may include, for example, a HDMI connector, a USB connector, a SD card connector, or an audio connector (e.g., a headphone connector).

The haptic module 179 may convert an electrical signal into a mechanical stimulus (e.g., a vibration or motion) or electrical stimulus which may be recognized by a user via his tactile sensation or kinesthetic sensation. According to an embodiment of the disclosure, the haptic module 179 may include, for example, a motor, a piezoelectric element, or an electric stimulator.

The camera module 180 may capture a still image or moving images. According to an embodiment of the disclosure, the camera module 180 may include one or more lenses, image sensors, image signal processors, or flashes.

The power management module 188 may manage power supplied to the electronic device 101. According to an embodiment of the disclosure, the power management module 188 may be implemented as at least part of, for example, a power management integrated circuit (PMIC).

The battery 189 may supply power to at least one component of the electronic device 101. According to an embodiment of the disclosure, the battery 189 may include, for example, a primary cell which is not rechargeable, a secondary cell which is rechargeable, or a fuel cell.

The communication module 190 may support establishing a direct (e.g., wired) communication channel or wireless communication channel between the electronic device 101 and an external electronic device (e.g., the external electronic device 102, the external electronic device 104, or the server 108) and performing communication through the established communication channel. The communication module 190 may include one or more communication processors that are operable independently from the processor 120 (e.g., the application processor (AP)) and supports a direct (e.g., wired) communication or a wireless communication. According to an embodiment of the disclosure, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device 104 via a first network 198 (e.g., a short-range communication network, such as Bluetooth™, wireless-fidelity (Wi-Fi) direct, or infrared data association (IrDA)) or a second network 199 (e.g., a long-range communication network, such as a legacy cellular network, a 5th generation (5G) network, a next-generation communication network, the Internet, or a computer network (e.g., a local area network (LAN) or a wide area network (WAN)). These various types of communication modules may be implemented as a single component (e.g., a single chip), or may be implemented as multi components (e.g., multi chips) separate from each other. The wireless communication module 192 may identify or authenticate the electronic device 101 in a communication network, such as the first network 198 or the second network 199, using subscriber information (e.g., international mobile subscriber identity (IMSI)) stored in the subscriber identification module 196.

The wireless communication module 192 may support a 5G network, after a 4th generation (4G) network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., the mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), array antenna, analog beam-forming, or large scale antenna. The wireless communication module 192 may support various requirements specified in the electronic device 101, an external electronic device (e.g., the external electronic device 104), or a network system (e.g., the second network 199). According to an embodiment of the disclosure, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1ms or less) for implementing URLLC.

The antenna module 197 may transmit or receive a signal or power to or from the outside (e.g., the external electronic device). According to an embodiment of the disclosure, the antenna module 197 may include one antenna including a radiator formed of a conductor or conductive pattern formed on a substrate (e.g., a printed circuit board (PCB)). According to an embodiment of the disclosure, the antenna module 197 may include a plurality of antennas (e.g., an antenna array). In this case, at least one antenna appropriate for a communication scheme used in a communication network, such as the first network 198 or the second network 199, may be selected from the plurality of antennas by, e.g., the communication module 190. The signal or the power may then be transmitted or received between the communication module 190 and the external electronic device via the selected at least one antenna. According to an embodiment of the disclosure, other parts (e.g., radio frequency integrated circuit (RFIC)) than the radiator may be further formed as part of the antenna module 197.

According to various embodiments of the disclosure, the antenna module 197 may form a mmWave antenna module. According to an embodiment of the disclosure, the mmWave antenna module may include a printed circuit board, a RFIC disposed on a first surface (e.g., the bottom surface) of the printed circuit board, or adjacent to the first surface and capable of supporting a designated high-frequency band (e.g., the mmWave band), and a plurality of antennas (e.g., array antennas) disposed on a second surface (e.g., the top or a side surface) of the printed circuit board, or adjacent to the second surface and capable of transmitting or receiving signals of the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment of the disclosure, commands or data may be transmitted or received between the electronic device 101 and the external electronic device 104 via the server 108 coupled with the second network 199. The external electronic devices 102 or 104 each may be a device of the same or a different type from the electronic device 101. According to an embodiment of the disclosure, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another embodiment of the disclosure, the external electronic device 104 may include an internet-of-things (IoT) device. The server 108 may be an intelligent server using machine learning and/or a neural network. According to an embodiment of the disclosure, the external electronic device 104 or the server 108 may be included in the second network 199. The electronic device 101 may be applied to intelligent services (e.g., a smart home, a smart city, a smart car, or healthcare) based on 5G communication technology or IoT-related technology.

Figure 2:
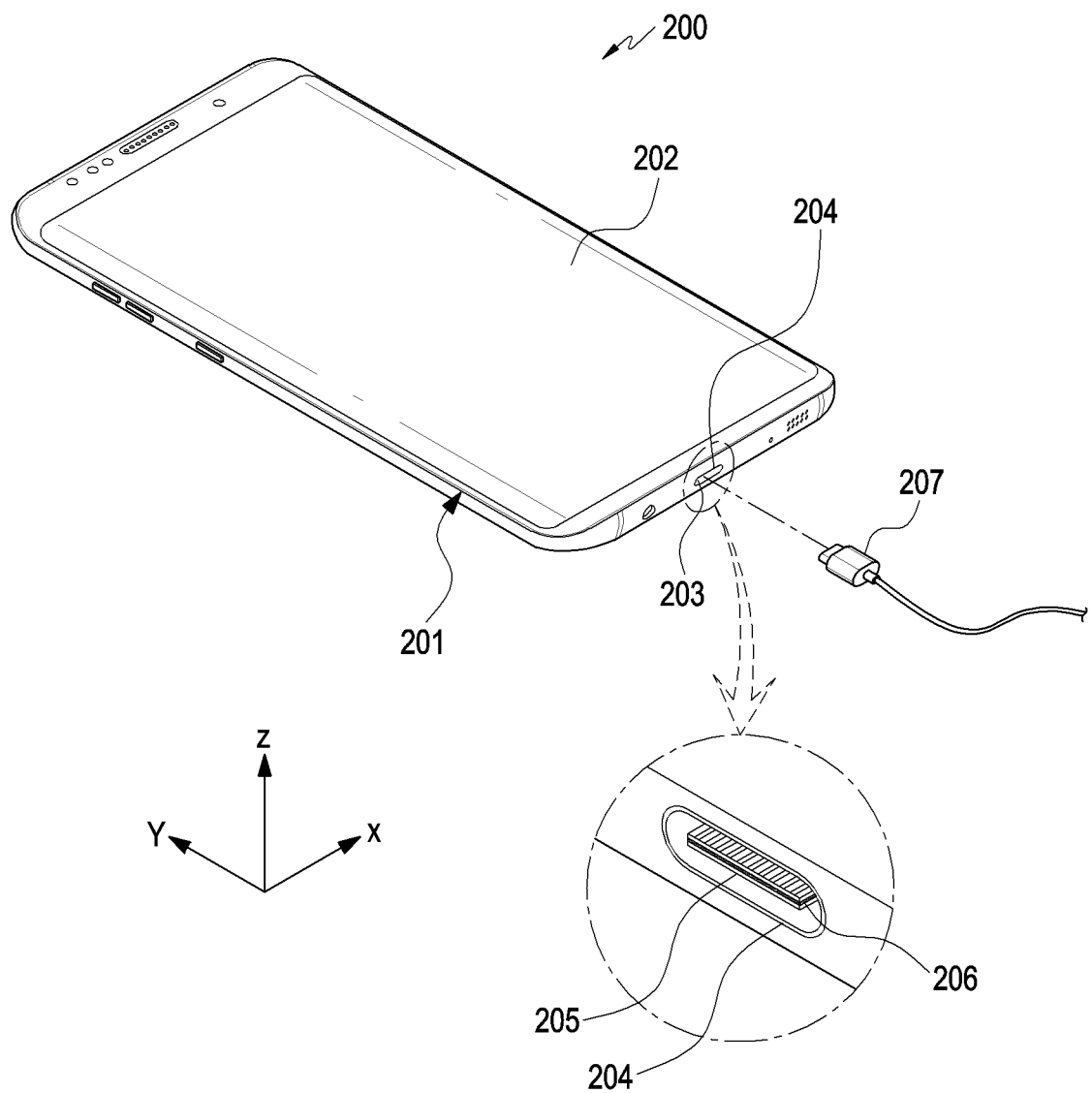
FIG. 2 is a perspective view illustrating an electronic device supporting a connector according to an embodiment of the disclosure.

FIG. 2 is a perspective view illustrating an electronic device supporting a connector according to an embodiment of the disclosure.

Referring to FIG. 2, in the three-axis rectangular coordinate system as shown in FIG. 2, 'X,' 'Y,' and 'Z,' respectively, may denote the width, length, and thickness directions of an electronic device 200 (e.g., the electronic device 101 of FIG. 1).

The electronic device 200 may include a housing 201. According to an embodiment of the disclosure, the housing 201 may be formed of a conductive and/or non-conductive member. According to an embodiment of the disclosure, the electronic device 200 may include a touchscreen display 202 (e.g., the display module 160 of FIG. 1) disposed to be exposed in at least part of the housing 201-1. According to an embodiment of the disclosure, the touchscreen display 202 may operate as a pressure-responsive touchscreen display including a pressure sensor.

According to various embodiments of the disclosure, the electronic device may include a connector 203 (e.g., the connecting terminal 178 of FIG. 1) for connecting to an external device. According to an embodiment of the disclosure, the connector 203 may be a socket-type connector.

According to an embodiment of the disclosure, an opening 204 may be formed in at least part of the housing 201 to expose the connector 203, and the connector 203 may be disposed in the opening 204. According to an embodiment of the disclosure, a header-type external connector 207 may be attached to the connector 203 in a forward or backward direction. In other words, the external connector 207 may be inserted into the connector 203 in any direction regardless of the direction. According to an embodiment of the disclosure, the external connector 207 may be connected to an external device via a cable. As the connector 203 and the external connector 207 are attached to each other, the electronic device 200 and the external device may be connected. According to an embodiment of the disclosure, the external device may be various external devices that may connect to the electronic device 200. For example, the external device is a USB on-the-go (OTG) device and may include a charger (or battery pack), an audio device, a laptop computer, a computer, a memory, or an antenna (e.g., digital multimedia broadcasting antenna or FM antenna).

According to an embodiment of the disclosure, the connector 203 may be used as an interface to connect the electronic device 200 with the external device or a power source (not shown). The electronic device 200 may transmit data of the electronic device 200 to, or receive data from, the external device through the external connector 207 connected to the connector 203. Further, the electronic device 200 may receive power from the power source through the connector 203 or charge the battery using the power source. According to an embodiment of the disclosure, the connector 203 may include USB type-C, and a contact board 205 may be formed in the connector 203. Further, a mid-plate 206 having electric conductivity may be formed in the contact board 205, and a plurality of pins may be formed on the upper and lower surfaces of the contact board 205.

Figure 3A:
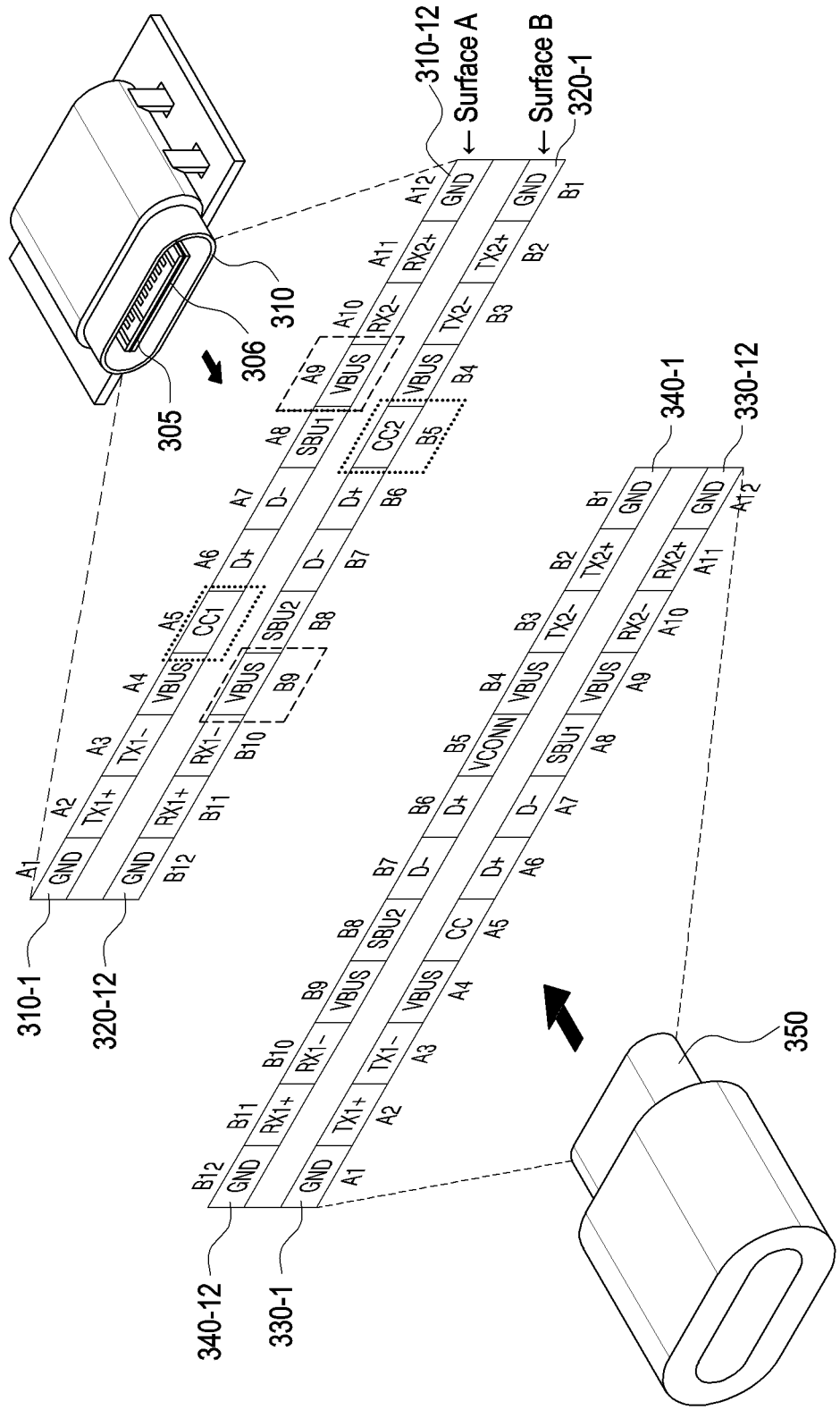
FIG. 3A is a view illustrating attachment between an electronic device and an external device according to an embodiment of the disclosure.

FIG. 3A is a view illustrating attachment between an electronic device and an external device according to an embodiment of the disclosure.

Here, a method for identifying whether an electronic device is attached to an external device is described with reference to FIG. 3B.

Figure 3B:
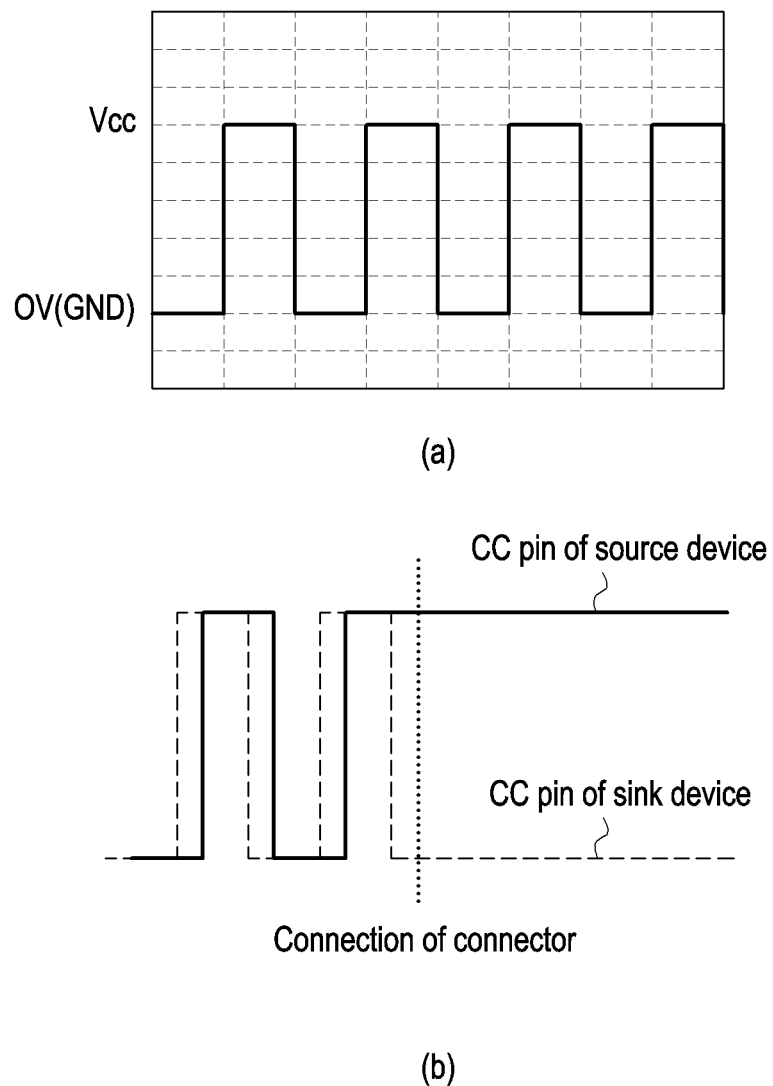
FIG. 3B is a view illustrating a method for identifying whether an attachment with an external device is made according to an embodiment of the disclosure.

FIG. 3B is a view illustrating a method for identifying whether an attachment with an external device is made according to an embodiment of the disclosure.

Referring to FIG. 3A, an electronic device (e.g., the electronic device 101 or 200) may be electrically connected with an external device through a first connector 310.

The first connector 310 of the electronic device may have an outer shape to allow a second connector 350 of the external device to be plugged in either way in a right direction or reverse direction, and a contact board 305 may be formed inside the first connector 310.

The contact board 305 may have 12 pins (or terminals) 310-1, 310-2, . . . , 310-12 formed on a first surface (e.g., surface A) corresponding to the right direction and have 12 pins (or terminals) 320-1, 320-2, . . . , 320-12 formed on a second surface (e.g., surface B) corresponding to the reverse direction. A mid plate 306 which is electrically conductive may be formed inside the contact board 305.

The second connector 350 of the external device may have 12 pins 330-1, 330-2, . . . , 330-12 formed on a first surface (e.g., surface A) to contact the 12 pins 310-1, 310-2, . . . , 310-12 formed on the first surface (e.g., surface A) of the contact board 305 and have 12 pins 340-1, 340-2, . . . , 340-12 formed on a second surface (e.g., surface B) to contact the 12 pins 320-1, 320-2, . . . , 320-12 formed on the second surface (e.g., surface B) of the contact board 305. The number of pins included in the second connector 350 of the external device may vary depending on the type of the external device. Depending on the type, the external device may have one or two CC pins. For example, for the second connector 350 of the external device to be plugged in in the direction of either the first surface or the second surface, the order in which the 12 pins are arranged on the first surface (e.g., surface A) may be identical to the order in which the 12 pins are arranged on the second surface (e.g., surface B). By the structure, the user may plug the second connector 350 of the external device into the first connector 310 of the electronic device, in a 180-degree rotated state.

According to an embodiment of the disclosure, the arrays of the pins formed on the first surface (e.g., surface A) and the second surface (e.g., surface B) of the contact board 305 are as shown in Table 1 below.

TABLE 1

| Pin No. | Pin No. | Signal Name | Function | Note |
|---|---|---|---|---|
| A1 | B1 | GND | Power | ground (e.g., Support for 60 W minimum (combined with all VBUS pins)) |

TABLE 1-continued

| Pin No. | Pin No. | Signal Name | Function | Note |
|---|---|---|---|---|
| A2 | B2 | TX1+ or SSTXp1 | USB 3.1 or Alternate Mode | Super speed TX positive (e.g., 10 Gb/s differential pair with TX1−) |
| A3 | B3 | TX1− or SSTXn1 | USB 3.1 or Alternate Mode | Super speed TX negative (e.g., 10 Gb/s differential pair with TX1+) |
| A4 | B4 | VBUS | Power | USB cable charging power (e.g., Support for 60 W minimum (combined with all VBUS Pins)) |
| A5 | B5 | CC1, CC2 | CC or VCONN | identification terminal |
| A6 | B6 | D+ | USB 2.0 | +line of the differential bi-directional USB signal |
| A7 | B7 | D− | USB 2.0 | −line of the differential bi-directional USB signal |
| A8 | B8 | SBU1, SBU2 | Alternate Mode | Side band Use: additional purpose pin (e.g., Audio signal, display signal, or the like) |
| A9 | B9 | VBUS | Power | USB cable charging power (e.g., Support for 60 W minimum (combined with all VBUS pins) |
| A10 | B10 | RX2− or SSRXn2 | USB 3.1 or Alternate Mode | Super speed RX negative (e.g., 10 Gb/s differential pair with RX2+) |
| A11 | B11 | RX2+ or SSRXp2 | USB 3.1 or Alternate Mode | Super speed RX positive (e.g., 10 Gb/s differential pair with RX2−) |
| A12 | B12 | GND | Power | ground (e.g., Support for 60 W minimum (combined with all VBUS pins)) |

According to various embodiments of the disclosure, the electronic device may recognize the physical connection of the external device as the external second connector 350 is attached through the first connector 310. According to an embodiment of the disclosure, the electronic device may recognize connection of the external device through at least one pin, e.g., an identification terminal (e.g., a configuration channel (CC) pin), among the plurality of signal pins included in the first connector 310 and identify the external device. For example, the electronic device and/or external device connected through a USB type-C connector may determine a power-related role or data-related role of the electronic device and external device based on the information recognized through the CC pin. For example, in terms of data transmission, it may be determined whether to operate as a host device or client device and, in terms of power supply, it may be determined whether to operate as a power supplying device (e.g., a source device) or a power receiving device (e.g., a sink device).

As described above, when the electronic device is a source device, the external device may be referred to as a sink device, and vice versa. Further, the external device may be referred to as an accessory device connectable through the first connector 310 of the electronic device. For example, when the external device is a charging device capable of supplying power, it may be a laptop computer, a travel charger (TA), or an assistant battery.

Referring to part (a) of FIG. 3B, before the external second connector 350 is attached through the first connector 310, a high and low (e.g., 0V or VCC voltage) signal may be detected as toggled depending on the pull-up (Rp)/pull-down (Rd) resistor connected to the identification terminal of the electronic device.

In contrast, when the external second connector 350 is attached through the first connector 310, as shown in part (b) of FIG. 3B, a high signal may be detected from one device through the identification terminal, and a low signal may be detected from the other device. For example, before until the first connector 310 and the second connector 350 are attached, a high or low signal may be output as toggled, and a low voltage level may be maintained through the CC pin for the device operating as a sink while a high voltage level may be maintained for the device operating as a source. This state may be maintained until they are detached and, when the second connector 350 is detached from the first connector 310, a toggling signal in which a high or low signal is repeated may be detected.

However, even though the connector is physically connected to the electronic device, toggling between a low voltage level and a high voltage level, rather than a constant voltage level, may repeat due to attachment of an external device that does not meet the regulations defined in the USB power-related standard or a foreign body (or foreign object) introduced into the identification terminal. Therefore, although a toggling signal is repeatedly detected from the electronic device, it is possible to clearly recognize whether there is a physical connection of the connector by identifying whether the signal comes from actual attachment or detachment of the connector, thereby preventing a malfunction of the connector.

Hereinafter, according to various embodiments of the disclosure, if a signal due to a change in connection state is repeatedly generated within a predetermined time, the electronic device may additionally identify the connection state of the connector according to a specific condition. A method for additionally identifying the connection state of the connector is described with reference to FIG. 4.

Figure 4:
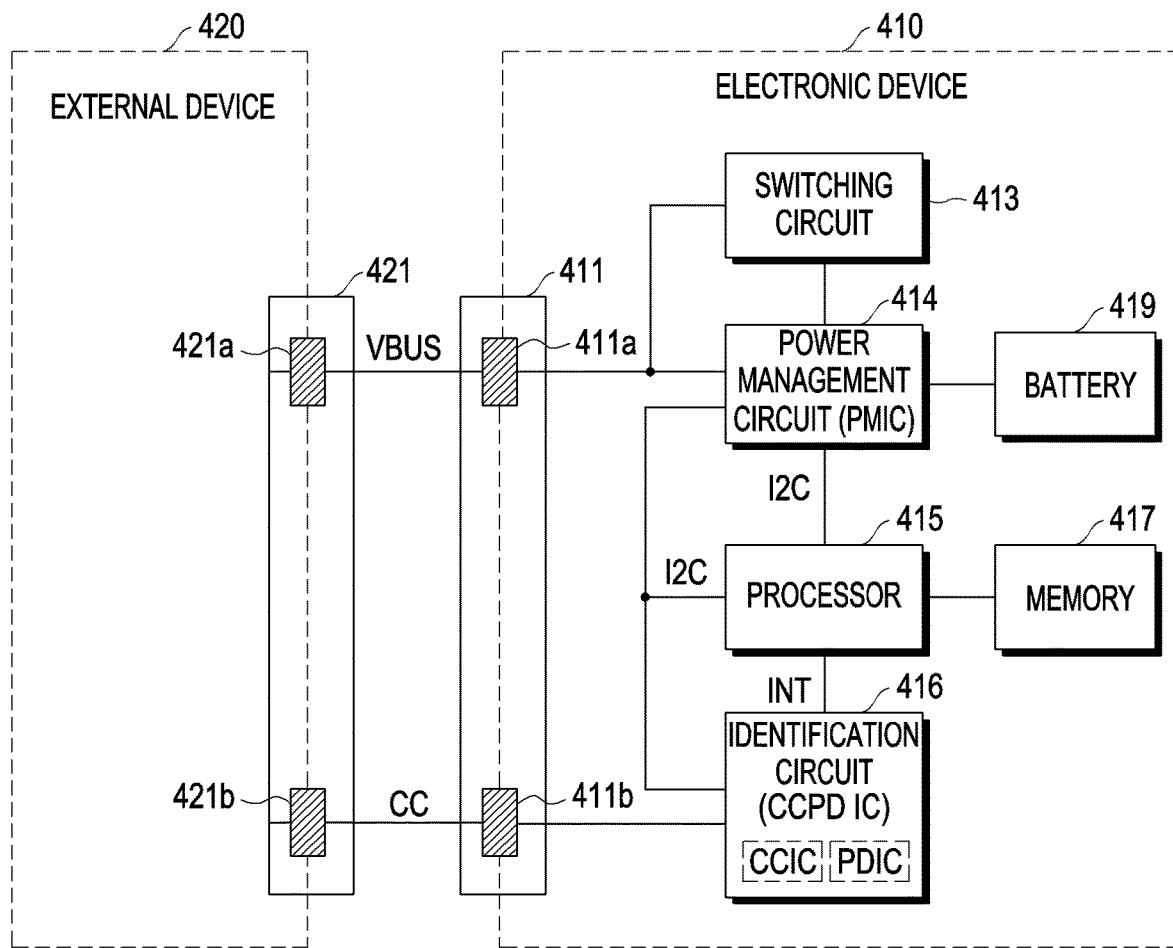
FIG. 4 is a block diagram illustrating an internal configuration of an electronic device for controlling a connector according to an embodiment of the disclosure.

FIG. 4 is a block diagram illustrating an internal configuration of an electronic device for controlling a connector according to an embodiment of the disclosure.

Referring to FIG. 4, an electronic device 410 and an external device 420 may be connected through their respective connectors 411 and 421. The connectors 411 and 421 may transfer power or analog or digital data to the inside/outside of the device. According to various embodiments of the disclosure, the connectors 411 and 421 may be connectors supporting USB type-C. Accordingly, the electronic device 410 and the external device 420 may transfer power therebetween through USB type-C connectors 411 and 421.

When the electronic device 410 is electrically connected to the external device 420, the electronic device 410 may receive power from the external device 420. For example, the electronic device 410 may receive power from a power terminal 421a of the external device 420 through a power terminal (e.g., VBUS of the USB connector) 411a of the connector 411. The electronic device 410 may be driven using the power supplied from the external device 420.

According to various embodiments of the disclosure, the control circuit of the electronic device 410 may include a switching circuit 413, a power management circuit (power management IC (PMIC)) 414, a processor 415, and an identification circuit 416 (e.g., CCPD IC). According to an embodiment of the disclosure, the control circuit may be a separate component from the processor 415 and may be an integrated circuit of the power management circuit 414 and the identification circuit 416. In addition to the control circuit, the electronic device 410 may include a connector 411, a memory 417, and a battery 419. According to various embodiments of the disclosure, at least some of the switching circuit 413, the power management circuit 414, the processor 415, and the identification circuit 416 (e.g., CCPD IC) may be circuits for identifying the operation mode (e.g., sink or source operation) of the electronic device 410 and may be implemented as a single IC. According to various embodiments of the disclosure, at least some of the switching circuit 413, the power management circuit 414, and the identification circuit 416 (e.g., CCPD IC) may be implemented as a single IC, and the IC including the processor 415 may be configured as a separate IC.

The connector 411 may include one or more signal terminals, e.g., a power terminal 411a for supplying or receiving power and an identification terminal 411b for identifying the external device 420. The arrangement of the power terminal 411a and the identification terminal 411b is not limited to that shown in FIG. 4 but may be varied depending on the characteristics of the electronic device 410. The first connector 411 may have USB type-C specifications and, in such a case, the power terminal 411a may correspond to the VBUS pin, and the identification terminal 411b may correspond to the CC pin (e.g., CC1 or CC2). Here, terminal may be referred to as a pin.

The switching circuit 413 may include at least one element and may be configured as a circuit to change a current transmission path depending on a specific control signal or specific condition or to short or open the current transmission path. For example, the switching circuit 413 may include an over voltage protection (OVP) circuit.

The power management circuit 414 may be electrically connected with the connector 411 and may control the voltage of the power supplied to each component included in the electronic device 410. The power management circuit 414 may output a preset voltage.

The power management circuit 414 may receive the power of the external device 420 (e.g., a charger or battery pack) supplying external power through the connector 411 and output a preset voltage and may charge the battery 419 electrically connected thereto. Or, the power management circuit 414 may provide part of the power supplied from the battery 419 to the external device 420 requiring power, through the connector 411.

The processor 415 may be electrically connected with the connector 411, control the signal flow between the blocks of the electronic device 410 and/or operation of the electronic device 410, and perform a data processing function for processing data. For example, the processor 415 may be, e.g., a central processing unit (CPU), an application processor (AP), a micro-control unit (MCU), or a micro-processor unit (MPU). The processor 415 may be formed as a single core processor or a multi-core processor.

When attached or detached from the external device 420, the processor 415 may recognize it through an interrupt signal line (e.g., INT) connected with the identification circuit 416.

The processor 415 may be connected with the power management circuit 414 or the identification circuit 416 through an interface. For example, inter-integrated circuit (I2C) communication-type data may be output to the processor 415 through the interface.

The memory 417 may be electrically connected to the processor 415 and may store various information and programs necessary to prevent a malfunction of the connector according to various embodiments. For example, the program may include a routine to detect connection of the external device 420 through the connector 411, a routine to identify the type of the external device 420 when the external device 420 is connected, and a routine to set to correspond to the identified external device 420.

Further, instructions for providing a notification through the display of the electronic device 410 and changing the operation of the electronic device 410 based on the presence or absence of a foreign body or abnormal charging may be previously stored in the memory 417.

According to various embodiments of the disclosure, an electronic device 410 may comprise an application processor (e.g., the processor 415) and a memory 417 electrically connected with the application processor. The memory 417 may store instructions that, when executed, enable the electronic device (or application processor) to monitor attachment with an external device 420 through an identification terminal among the one or more signal terminals, identify whether a designated number of, or more, monitoring signals related to attachment with the external device 420 are detected during a designated time, and identify whether there is the attachment with the external device 420, based on a voltage of a power terminal among the one or more signal terminals, if the detection of the monitoring signals is identified.

According to various embodiments of the disclosure, the instructions may be configured to enable the electronic device to detect the voltage of the power terminal 411a through the power management circuit 414 while monitoring and, based on no voltage detected, identify whether a designated number of, or more, monitoring signals related to attachment with the external device 420 during the designated time are detected.

According to various embodiments of the disclosure, the instructions may be configured to enable the electronic device to identify (or count) occurrences of interrupt signals in the state in which there is no voltage (e.g., NO VBUS) detected for the power terminal 411a through the power management circuit 414 whenever a toggling-induced interrupt signal is received while monitoring.

According to various embodiments of the disclosure, the instructions may be configured to enable the electronic device to identify whether a designated number of, or more (e.g., 30 times or more), monitoring signals are detected for the designated time (e.g., 60 seconds) in the no-powered context (e.g., NO VBUS) through the power terminal 411a.

As described above, at least some of operations of detecting a connector malfunction of the electronic device 410 may be implemented as instructions stored in the form of program modules (e.g., firmware), in a storage medium.

The identification circuit 416 may include at least one of a micro-usb interface controller (MUIC), a cable and connector integrated chip (CCIC), or a power delivery integrated chip (PDIC).

The identification circuit 416 may identify whether the external device 420 connected to the identification terminal 411b of the connector 411 is attached. According to an embodiment of the disclosure, the identification circuit 416 may identify the value detected for the identification terminal 411b of the connector 411 and may identify whether it is attached (or connected) to or detached (or disconnected) from the external device 420 depending on the detected value. Specifically, the identification circuit 416 may identify the connection state with the external device 420 based on the value (e.g., resistance, voltage, current, or impedance) detected for the identification terminal 411b. For example, the identification circuit 416 may determine whether it is attached with the external device 420 by measuring the voltage due to the pull-up (Rp)/pull-down (Rd) resistor connected to the identification terminal 411b and may determine the operation mode, e.g., whether to operate as a source or a sink.

Further, the identification circuit 416 may transfer a control signal (e.g., interrupt signal) related to attachment or detachment from the external device 420 to the processor 415. In this case, when attached with the external device 420, a high voltage level or low voltage level may be detected constantly. The identification circuit 416 may recognize it and transfer the interrupt signal to the processor 415, thereby indicating the connection state. This state may be maintained until before detached. On the other hand, when detached from the external device 420, a fixed voltage level may change its state to toggle. For example, as a high voltage level (or high signal) is changed into a low voltage level (or low signal), or a low voltage level (or low signal) is changed into a high voltage level (or high signal), the identification circuit 416 may recognize it and transfer the interrupt signal to the processor 415, thereby indicating the detached state. Whenever receiving such interrupt signal from the identification circuit 416, the processor 415 may identify the state through an I2C communication-type interface with the power management circuit 414 to identify the actual state of the connector 411.

In this case, despite being in the state attached with the external device 420, an abnormal state may occur in which an interrupt signal is frequently transferred to the processor 415 due to attachment of an external device failing to meet the regulations defined in the USB power-related standard or a foreign body introduced to the identification terminal.

Accordingly, in an abnormal state in which a signal due to a change in connection state is repeatedly generated within a predetermined time, the connection state of the connector may be additionally identified according to a specific condition to prevent a malfunction of the connector.

According to various embodiments of the disclosure, in the abnormal state, the electronic device 410 may use not only the value for the identification terminal 411b but also the value for the power terminal 411a to additionally identify the connection state of the connector 411.

According to various embodiments of the disclosure, the connector 421 of the external device 420 supporting the USB type-C standard may be inserted into the connector 411. Accordingly, the processor 415 may detect insertion of the connector 421 of the external device 420. For example, the processor 415 may perform the operation of determining whether it is in a state of being physically connected with the external device 420 by identifying the size of the resistance according to attachment of the external device 420. For example, if a pull-up resistor Rp is connected to the identification terminal 421b of the external device 420, a VCC voltage according to the pull-up resistor may be applied to the CC1 or CC2 terminal of the identification terminal 411b. In contrast, a voltage according to the pull-down resistor Rd may be applied to the CC1 or CC2 terminal of the identification terminal 411b. As described above, a high and low (e.g., 0V or VCC voltage) signal may be detected as toggling through the identification terminal 411b. Accordingly, when a VCC voltage is applied to the identification terminal 411b, the external device 420 may operate as a source supplying power, and the electronic device 410 may operate as a sink receiving power.

According to an embodiment of the disclosure, at least some operations of the processor 415 may be performed by the identification circuit 416.

The processor 415 may identify the operation mode based on the control signal from the identification circuit 416 based on the voltage applied to the identification terminal 411b and may recognize the attached state. Further, the processor 415 may identify the type of the external device 420 attached to the electronic device 410. For example, if the external device 420, such as a portable charger (TA) or a battery pack, is connected, the processor 415 may identify the type of the external device 420 by identifying the size of the resistance according to connection with the external device 420.

Accordingly, if the external device 420 is identified as a source device capable of supplying power (or current), the processor 415 may identify the size of the power supplied from the external device 420. For example, the processor 415 may receive information about the VBUS voltage of the power terminal 411a from the power management circuit 414. Accordingly, the battery 419 may be charged with the power supplied from the external device 420 through the power management circuit 414.

The following example embodiments of the disclosure focus primarily on the electronic device 410 operating as a sink.

According to various embodiments of the disclosure, the processor 415 may monitor attachment of the external device 420 through the identification circuit 416 connected with the identification terminal 411b and identify whether a designated number of, or more, monitoring signals related to attachment with the external device 420 are detected during a designated time. According to an embodiment of the disclosure, the processor 415 may identify the value detected for the power terminal 411a whenever a low or high signal according to toggling is detected. Here, the value detected for the power terminal 411a may mean the voltage currently applied to the electronic device 410. For example, a designated time after starting to charge the battery 419 with the power supplied from the external device 420 through the power management circuit 414, the voltage applied to the power terminal 411a may be identified.

As described above, when a toggling-induced low or high signal is detected in a state in which a high or low signal is fixed after detecting attachment with the external device 420, the identification circuit 416 may recognize it and transfer an interrupt signal to the processor 415 to thereby indicate a change of the connection state. If receiving the interrupt signal from the identification circuit 416 after detecting the attachment, the processor 415 may recognize the detached state even when the attachment with the external device 420 is actually maintained. Further, if receiving a toggling-induced interrupt signal from the identification circuit 416, the processor 415 may recognize the attached state. As such, as the operations of recognizing the attached state and the detached state are repeated, the processor 415 may maintain the wake-up state due to the frequent interrupt signals without switching into the sleep state, causing quick discharging.

Accordingly, the processor 415 may count the occurrences of toggling-induced signals, based on the interrupt signal from the identification circuit 416 and, if signals due to a designated number of times of toggling is generated during a predetermined time are generated, the processor 415 may regard it as an abnormal state and additionally identify the connection state of the connector 411.

According to various embodiments of the disclosure, the processor 415 may identify the value detected for the power terminal 411a whenever detecting a toggling-induced low or high signal by the identification circuit 416 connected with the identification terminal 411b. For example, the processor 415 may identify the voltage applied to the power terminal 411a through the power management circuit 414 while monitoring the attachment of the external device 420 in response to the toggling-induced low or high signal. Although in FIG. 4, 'voltage' is exemplified for the purpose of describing various embodiments of the disclosure, 'voltage' may be interchangeably used with 'current,' 'power,' or 'impedance.'

If the battery 419 of the electronic device 410 is charged with the power supplied from the external device 420 and the charging is complete (e.g., full charge state), power supply through the power terminal 411a may be stopped. Accordingly, the voltage applied to the power terminal 411a may be 0.

As such, as toggling-induced interrupt signals are repeatedly generated in the no-powered context, the processor 415 may identify whether a designated number of, or more, monitoring signals related to attachment with the external device during a designated time are detected in response to the occurrence of the interrupt signal. According to an embodiment of the disclosure, the processor 415 may detect the voltage of the power terminal 411a through the power management circuit 414 while monitoring and, based on no voltage detected, identify whether a designated number of, or more, monitoring signals related to attachment with the external device 420 during the designated time are detected. For example, the processor 415 may identify (or count) occurrences of interrupt signals in the state in which there is no voltage (e.g., NO VBUS) detected for the power terminal 411a through the power management circuit 414 whenever a toggling-induced interrupt signal is received while monitoring.

According to various embodiments of the disclosure, the processor 415 may identify whether a designated number of, or more (e.g., 30 times or more), monitoring signals are detected for the designated time (e.g., 60 seconds) in the no-powered context (e.g., NO VBUS) through the power terminal 411a.

If detection of the monitoring signals (e.g., when detected 30 times or more) during the designated time (e.g., 60 seconds) in the no-powered context (e.g., NO VBUS) through the power terminal 411a is identified, the processor 415 may identify whether it is actually physically attached (or connected) to or detached from the external device 420 based on the voltage (e.g., VBUS voltage) of the power terminal 411a. According to an embodiment of the disclosure, upon identifying detection of a designated number of, or more, monitoring signals related to attachment with the external device 420 during the designated time through the identification circuit 416 in the no-powered context (e.g., NO VBUS) through the power terminal 411a, the processor 415 may control the identification circuit 416 to at least temporarily stop transferring of the toggling-induced interrupt signal from the identification circuit 416 to the processor 415. As such, as transfer of the interrupt signal to the processor 415 is temporarily restricted, the processor 415 may refrain from recognizing an abnormal attached state or detached state. According to an embodiment of the disclosure, the processor 415 may instruct the control circuit (e.g., a control circuit including a PDIC) to change the VBUS threshold through IC2 communication while monitoring. For example, upon identifying detection of a designated number of, or more, monitoring signals related to attachment with the external device during the designated time when monitoring, the processor 415 may configure the control circuit to change the threshold (e.g., VBUS threshold) for recognizing the voltage of the power terminal 411a. The abnormal VBUS value may be disregarded by changing the VBUS threshold in such a manner.

According to various embodiments of the disclosure, upon identifying detection of a designated number of, or more, monitoring signals related to attachment with the external device 420 during the designated time through the identification circuit 416 in the no-powered context (e.g., NO VBUS) through the power terminal 411a, the processor 415 may identify whether it is in a connected state for charging or in a detached state not requiring charging depending on the voltage (e.g., VBUS voltage) of the power terminal 411a. According to an embodiment of the disclosure, the processor 415 may identify the value detected for the power terminal 411a through the power management circuit 414.

According to an embodiment of the disclosure, if the voltage (e.g., VBUS voltage) of the power terminal 411a falls within a first designated range, the processor 415 may identify the state detached from the external device 420. For example, in a case where the voltage of the power terminal 411a falls within the first designated range (e.g., post-full charge voltage or 0V), despite no connection to the external device 420, power for charging the battery 419 may not be supplied. In this context, the identification circuit 416 may continuously detect the toggling-induced signal. In such a case, the identification circuit 416 may refrain from transferring the interrupt signal, indicating detection of a toggling-induced signal, to the processor 415. At this time, the power management circuit 414 may notify the identification circuit 416 through the I2C interface that the voltage of the power terminal 411a is absent. Alternatively, the processor 415 may receive the context, in which the voltage of the power terminal 411a is absent, from the power management circuit 414 and notify the identification circuit 416 of it through the I2C interface.

Accordingly, if receiving a signal indicating that there is no voltage of the power terminal 411a, through the I2C interface while transfer of the interrupt signal to the processor 415 is temporarily restricted, the identification circuit 416 may transfer, to the processor 415, a signal indicating that charging is not required and it is in the detached state. Thus, the processor 415 may recognize the state detached from the external device 420. Accordingly, if the voltage of the power terminal 411a falls within the first designated range, the processor 415 may release the pause of the identification circuit 416 outputting the interrupt signal related to attachment with the external device 420 to the processor 415. If the voltage of the power terminal 411a falls within the first designated range, charging is not really performed. Thus, the processor 415 may recognize the detached state and switch into sleep mode. As such, the processor 415 does not receive an abnormal state-induced interrupt signal from the identification circuit 416 and may switch into sleep mode, decreasing current consumption and hence preventing quick discharge.

Meanwhile, according to an embodiment of the disclosure, if the voltage (e.g., VBUS voltage) of the power terminal 411a falls within a second designated range, the processor 415 may identify the state attached with the external device 420. For example, in a case where the voltage of the power terminal 411a falls within the second designated range (e.g., 4.75V or more or 5V or more), the identification circuit 416 may continuously detect the toggling-induced signal in a context where it is connected to the external device 420 and receives power through the power terminal 411a for charging the battery 419. In such a case, the identification circuit 416 may refrain from transferring the interrupt signal, indicating detection of a toggling-induced signal, to the processor 415. Accordingly, the processor 415 may recognize that attachment with the external device 420 is maintained for charging.

According to various embodiments of the disclosure, the electronic device 410 may limit unnecessary display of a notification message indicating whether a connection is made whenever an interrupt signal is generated due to a change in connection state and hence prevent the operation of leading the user to check the insertion state of the connector, thereby allowing for more stable use.

Although the foregoing embodiments focus primarily on the electronic device 410 operating as a sink, it should be appreciated that embodiments of the disclosure may also be applied even where the electronic device operates as a source.

The following example embodiments of the disclosure focus primarily on the electronic device 410 operating as a source.

According to various embodiments of the disclosure, the processor 415 may identify, through the identification terminal 411b, whether the external device 420 is a device for supplying power to the electronic device 410 or a device for receiving power from the electronic device 410.

If the external device 420 is identified as a device for supplying power to the electronic device 410, the processor 415 may control to supply the received voltage to the power management circuit 414 to perform charging using part of the voltage received from the external device 420 through the power terminal 411a. In contrast, in a case where the external device 420 is identified as a device for receiving power from the electronic device 410, if detection of a designated number of, or more, monitoring signals related to attachment with the external device during the designated time is identified through the identification circuit 416, the processor 415 may provide part of the power supplied from the battery 419 through the power management circuit 414 to the external device 420 requiring power, attached to the connector 411.

For example, according to the USB type-C standard, in the default USB state, the current applied to the identification terminal 411b may be about 80 uA and, when the current is detected, the identification circuit 416 may transfer the interrupt signal related to attachment to the processor 415. Accordingly, the processor 415 may determine whether it is in a state attached with the external device 420 in response to the interrupt signal and may determine the operation mode, e.g., whether to operate as a source.

According to various embodiments of the disclosure, in the state of operating as a source, the processor 415 may identify whether a designated number of, or more (e.g., 30 times or more), monitoring signals are detected for the designated time (e.g., 60 seconds) in the context (e.g., NO VBUS) where no power is supplied to the external device 420 through the power terminal 411a.

According to various embodiments of the disclosure, upon identifying detection of a designated number of, or more, monitoring signals related to attachment with the external device 420 during the designated time through the identification circuit 416 in the no-powered context (e.g., NO VBUS) through the power terminal 411a, the processor 415 may regard it as an abnormal state and change the threshold, which is a reference for the identification circuit 416 to output an interrupt signal related to attachment with the external device 420 to the processor 415, into a designated threshold.

For example, the processor 415 may detect the current applied to the identification terminal 411b and identify whether there is a foreign body based on the detected current. If the current is applied to the identification terminal 411b in the context where a foreign body is present, normal power supply to the external device 420 may be difficult. Accordingly, the processor 415 may change the threshold in the identification circuit 416 to change the threshold, which is the reference for the identification circuit 416 to output the interrupt signal related to attachment with the external device 420 to the processor 415, into a designated threshold. For example, the processor 415 may increase the current value (or threshold) (e.g., about 80 uA) applied to the identification terminal 411b to the designated threshold (e.g., about 180 uA or about 330 uA).

Accordingly, after identifying a designated number of, or more, monitoring signals related to attachment with the external device 420 during the designated time through the identification circuit 416 in the context (e.g., NO VBUS) where no power is supplied through the power terminal 411a, if the detected value is the designated threshold (e.g., about 180 uA or about 330 uA), the processor 415 may regard it as the state attached with the external device 420. In contrast, the processor 415 may regard detection of a signal failing to meet the designated threshold as a wrong connector connection and recognize it as the detached state, so that the processor 415 may switch into sleep mode.

As described above, the processor 415 may identify the presence or absence of a foreign body based on the value detected for the identification terminal 411b and, if a foreign body is present, enable normal power supply to the external device 420 by readjusting the threshold into the designated threshold. Further, the processor 415 may identify whether there is a foreign body by comparing the value detected for the identification terminal 411b with the designated threshold. In this case, the changed designated threshold may be restored into the original threshold when the attachment with the external device 420 is actually released.

Meanwhile, although such an example has been described above in which it is the processor 415 that monitors attachment with the external device 420 and, if a designated number of, or more, monitoring signals related to attachment with the external device 420 are detected during the designated time, identifies whether it is attached with the external device based on the voltage of the power terminal among the one or more signal terminals, the entity of performing the operations may be a control circuit other than the processor 415. Here, the control circuit may be an IC into which the power management circuit 414 and the identification circuit 416 are integrated.

According to an embodiment of the disclosure, the control circuit including the power management circuit 414 and the identification circuit 416 may monitor attachment with the external device 420 and, upon detecting a designated number of, or more, monitoring signals related to attachment with the external device 420 during a designated time, identify whether it is attached with the external device based on the voltage of the power terminal among the one or more signal terminals.

According to another embodiment of the disclosure, the entity of performing the operations of monitoring attachment with the external device 420 and identifying detection of a designated number of, or more, monitoring signals related to attachment with the external device 420 during a designated time may be the identification circuit 416. If detection the designated number of, or more, monitoring signals related to attachment with the external device 420 during the designated time is identified by the identification circuit 416, the power management circuit 414 may identify whether it is attached with the external device 420 based on the voltage of the power terminal among the one or more signal terminals in response to the identification of the detection. Accordingly, if whether attached is identified based on the voltage of the power terminal by the power management circuit 414, the power management circuit 414 may notify the processor 415 of it and, if recognizing the detached state, the processor 415 may switch into sleep mode while performing the operation corresponding to the attached state if recognizing that the attached state is maintained.

According to another embodiment of the disclosure, the operations of monitoring attachment with the external device 420, identifying whether a designated number of, or more, monitoring signals related to attachment with the external device 420 are detected for a designated time, and allowing the control circuit to change the voltage recognition threshold (e.g., VBUS threshold) of the power terminal 411a in response to detection of the monitoring signals being identified may be performed by the processor 415, and the operation of identifying whether it is attached with the external device 420 based on the voltage of the power terminal 411a may be performed by the control circuit.

According to various embodiments of the disclosure, an electronic device 410 may comprise a connector 411 including one or more signal terminals and a control circuit electrically connected with the one or more signal terminals. The control circuit may be configured to monitor attachment with an external device 420 through an identification terminal among the one or more signal terminals, identify whether a designated number of, or more, monitoring signals related to attachment with the external device 420 are detected during a designated time, and identify whether there is the attachment with the external device 420, based on a voltage of a power terminal among the one or more signal terminals, in response to the detection of the monitoring signals being identified.

According to various embodiments of the disclosure, the control circuit may be configured to detect the voltage of the power terminal among the one or more signal terminals while monitoring and identify whether the designated number of, or more, monitoring signals related to attachment with the external device are detected during the designated time, based on the detected voltage being absent.

According to various embodiments of the disclosure, the control circuit may be configured to include an application processor 415, a power management circuit 414 electrically connected with the power terminal among the one or more signal terminals, and an identification circuit 416 electrically connected with the identification terminal among the one or more signal terminals, and based on the detection of the designated number of, or more, monitoring signals related to attachment with the external device 420 during the designated time being identified through the identification circuit 416 outputting the monitoring signals, at least temporarily stop outputting, by the identification circuit 416, an interrupt signal related to attachment with the external device 420 to the application processor 415.

According to various embodiments of the disclosure, the control circuit may be configured to identify a state detached from the external device 420 based on the voltage of the power terminal falling within a first designated range after the detection of the monitoring signals is identified.

According to various embodiments of the disclosure, the control circuit may be configured to release the stop of the output, by the identification circuit 416, of the interrupt signal related to the attachment with the external device 420 to the application processor 415 based on the voltage of the power terminal falling within a first designated range after the detection of the monitoring signals is identified.

According to various embodiments of the disclosure, the control circuit may be configured to identify a state attached with the external device 420 based on the voltage of the power terminal falling within a second designated range after the detection of the monitoring signals is identified.

According to various embodiments of the disclosure, the control circuit may be configured to identify whether the external device 420 is a device for supplying power to the electronic device 410 or the external device 420 is a device for receiving power from the electronic device 410 through the identification terminal among the one or more signal terminals, and supply a voltage, received from the external device 420 through the power terminal, to the power management circuit 414 to charge using part of the received voltage when the external device 420 is identified as the device for supplying the power.

According to various embodiments of the disclosure, the control circuit may be configured to, based on the external device 420 being identified as the device for receiving the power from the electronic device 410, in response to the detection of the designated number of, or more, monitoring signals related to attachment with the external device 420 during the designated time being identified through the identification circuit 416, change a threshold, which is a reference for outputting, by the identification circuit 416, the interrupt signal related to the attachment with the external device 420 to the application processor 415, into a designated threshold.

According to various embodiments of the disclosure, the control circuit may be configured to identify a detection value for the identification terminal after the detection of the monitoring signal is identified, and identify whether there is the attachment with the external device 420 by comparing the detection value with the designated threshold.

According to various embodiments of the disclosure, the identification terminal may include a USB type-C-based CC1 terminal or CC2 terminal. The power terminal may include a USB type-C-based VBUS terminal.

According to various embodiments of the disclosure, an electronic device 410 may comprise a connector 411 including one or more signal terminals, a control circuit electrically connected with the one or more signal terminals, and a processor 415 electrically connected with the control circuit. The processor 415 may be configured to monitor attachment with an external device through an identification terminal among the one or more signal terminals, identify whether a designated number of, or more, monitoring signals related to attachment with the external device are detected during a designated time, and in response to the detection of the monitoring signals being identified, allow the control circuit to change a voltage threshold of a power terminal among the one or more signal terminals. The control circuit may be configured to identify whether there is the attachment with the external device, based on a voltage of the power terminal.

According to an embodiment of the disclosure, the control circuit may include the power management circuit 414 and the identification circuit 416. For example, the control circuit may be configured as an IC into which the power management circuit 414 and the identification circuit 416 are integrated.

According to various embodiments of the disclosure, at least some of the switching circuit 413, the power management circuit 414, and the identification circuit 416 (e.g., CCPD IC) may be implemented as a single IC, and the IC including the processor 415 may be configured as a separate IC.

Figure 5:
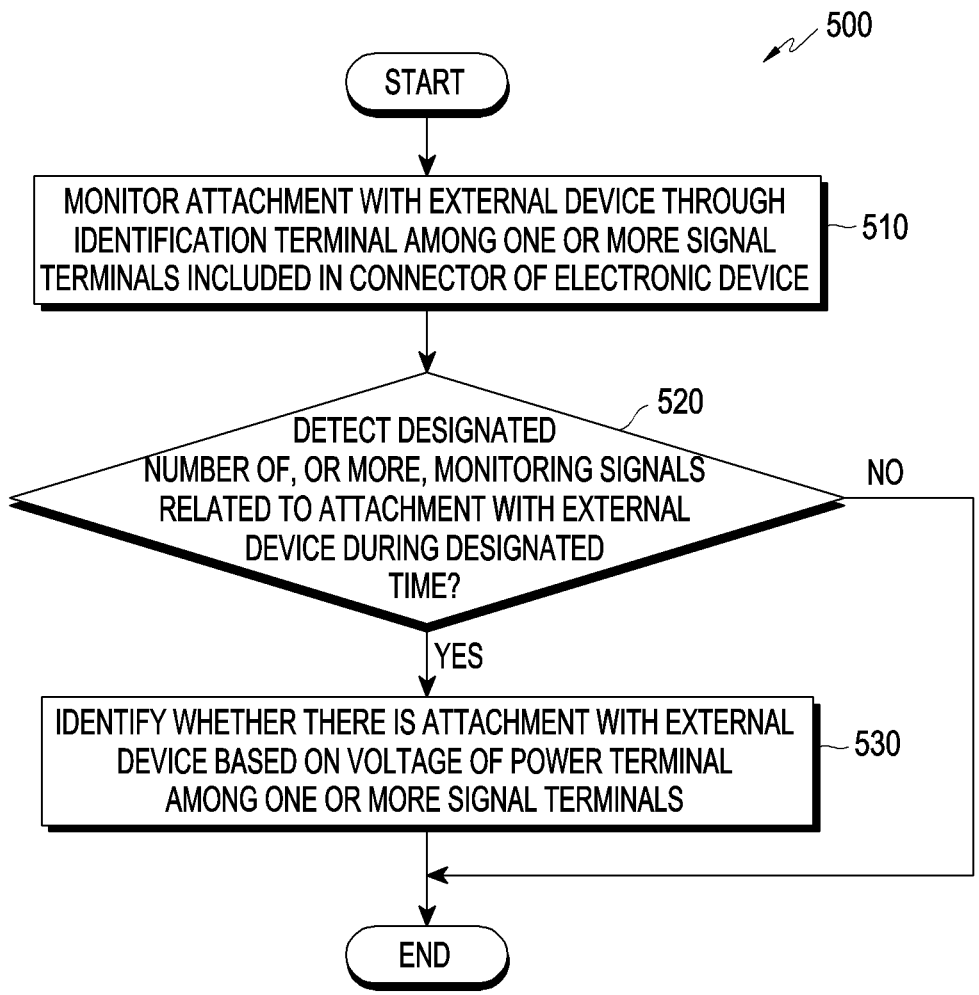
FIG. 5 is a flowchart illustrating operations for preventing a malfunction of a connector in an electronic device according to an embodiment of the disclosure.

FIG. 5 is a flowchart 500 illustrating operations for preventing a malfunction of a connector in an electronic device according to an embodiment of the disclosure.

Referring to FIG. 5, the operation method may include operations 510 to 530. Each operation of the operation method of FIG. 5 may be performed by at least one of an electronic device (e.g., the electronic device 101 of FIG. 1 or the electronic device 410 of FIG. 4) or at least one processor (e.g., at least one of the processor 120 of FIG. 1 or the processor 415 of FIG. 4) of the electronic device.

According to various embodiments of the disclosure, it may be assumed that the electronic device 410 recognizes that the external device 420 is attached through one of the CC1 terminal or the CC2 terminal of the identification terminal 411b.

In operation 510, the electronic device 410 may monitor attachment with the external device 420 through the identification terminal 411b among one or more signal terminals included in the connector 411 of the electronic device 410. According to an embodiment of the disclosure, the electronic device 410 may identify whether a toggling-induced low or high signal is detected in a state in which a high or low signal is fixed after detecting associated with the external device 420, thereby monitoring associated with the external device 420.

In operation 520, the electronic device 410 may identify whether a designated number of, or more, monitoring signals related to attachment with the external device 420 are detected during a designated time. According to an embodiment of the disclosure, the electronic device 410 may detect the voltage of the power terminal 411a among the one or more signal terminals while monitoring and, based on no voltage detected, identify whether a designated number of, or more, monitoring signals related to attachment with the external device 420 during the designated time are detected. For example, the electronic device 410 may identify whether a designated number of, or more (e.g., 30 times or more), monitoring signals are detected for the designated time (e.g., 60 seconds) in the no-powered context (e.g., NO VBUS) through the power terminal 411a.

According to an embodiment of the disclosure, if identifying detection of a designated number of, or more, monitoring signals related to attachment with the external device during the designated time through the identification circuit electrically connected with the identification terminal among the one or more signal terminals, the electronic device 410 may control the identification circuit to at least temporarily stop the operation of outputting an interrupt signal related to associated with the external device to the application processor of the electronic device.

In operation 530, if detection of the monitoring signals is identified, the electronic device 410 may identify whether it is attached with the external device 420 based on the voltage of the power terminal 411a among the one or more signal terminals.

According to an embodiment of the disclosure, after identifying detection of the monitoring signals, if the voltage of the power terminal 411a falls within the first designated range, the electronic device 410 may identify the state detached from the external device 420. For example, if the voltage of the power terminal 411a is a low voltage level, the electronic device 410 may regard it as not being charged and determine that attachment need not be maintained any longer so that it is in the state detached from the external device 420 and then switch into sleep mode.

According to an embodiment of the disclosure, if the voltage of the power terminal 411a falls within the first designated range after detection of the monitoring signals is identified, the electronic device 410 may control the identification circuit 416 to release the pause of the operation of outputting the interrupt signal related to associated with the external device 420 to the processor 415.

In contrast, according to an embodiment of the disclosure, after identifying detection of the monitoring signals, if the voltage of the power terminal 411a falls within the second designated range, the electronic device 410 may identify the state attached with the external device. For example, if the voltage of the power terminal 411a is the high voltage level, the electronic device 410 may determine being charged and maintain the state attached with the external device 420.

According to an embodiment of the disclosure, the method may further comprise identifying whether the external device is a device for supplying power to the electronic device or the external device is a device for receiving power from the electronic device through the identification terminal among the one or more signal terminals and supplying a voltage, received from the external device through the power terminal, to a power management circuit electrically connected with the power terminal among the one or more signal terminals to charge using part of the received voltage when the external device is identified as the device for supplying the power.

According to an embodiment of the disclosure, the method may further comprise, when the external device is identified as the device for receiving the power from the electronic device, in response to the detection of the designated number of, or more, monitoring signals related to attachment with the external device during the designated time being identified through the identification circuit, changing a threshold, which is a reference for outputting, by the identification circuit, the interrupt signal related to the attachment with the external device to the application processor, into a designated threshold.

According to an embodiment of the disclosure, the method may further comprise identifying a detection value for the identification terminal after the detection of the monitoring signal is identified and identifying whether there is the attachment with the external device by comparing the detection value with the designated threshold.

Figure 6:
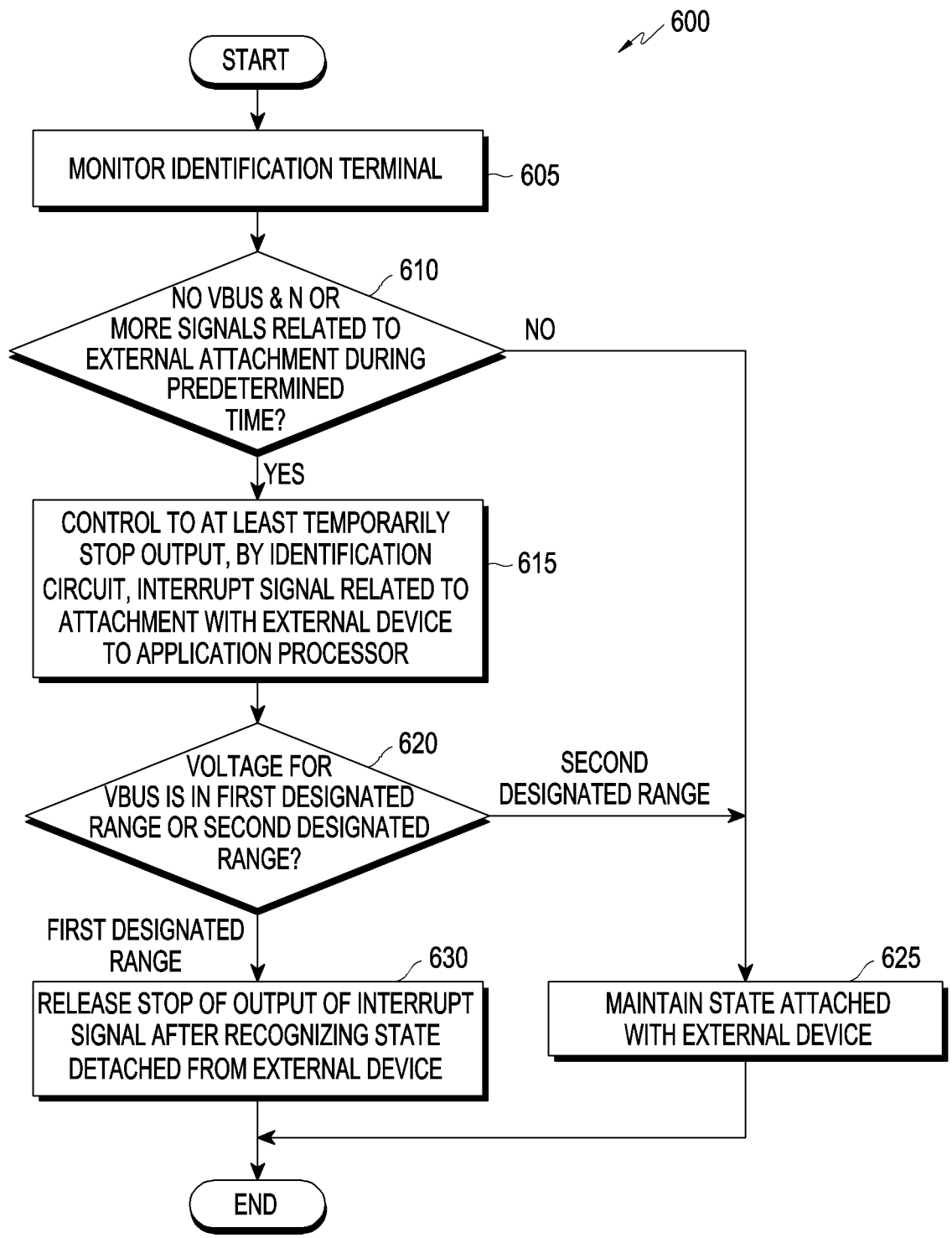
FIG. 6 is a flowchart illustrating operations of an electronic device operating as a sink according to an embodiment of the disclosure.

FIG. 6 is a flowchart 600 illustrating operations of an electronic device operating as a sink according to an embodiment of the disclosure.

According to various embodiments of the disclosure, it may be assumed that the electronic device 410 recognizes that the external device 420 is attached through one of the CC1 terminal or the CC2 terminal of the identification terminal 411b. An example in which the electronic device 410 operates as a sink is described in connection with FIG. 6.

Referring to FIG. 6, if the electronic device 410 is a sink device and is attached with the external device 420 operating as a source device, the electronic device 410 may monitor the identification terminal 411b in the state of operating in the sink mode in operation 605.

In operation 610, the electronic device 410 may identify whether signals related to external attachment are detected N times or more for a predetermined time in a state in which no voltage is detected (e.g., NO VBUS) through the power terminal 411a. For example, when operating in the sink mode, the electronic device 410 may count the number of times of signal generation due to toggling based on the interrupt signal indicating attachment or detachment from the identification circuit 416 and identify whether signals are generated due to a designated number of, or more, times of toggling during a predetermined time.

If N or more (e.g., 30 or more) interrupt signals are generated for a predetermined time (e.g., 60 seconds) in the no-powered context (e.g., NO VBUS) through the power terminal 411a, the electronic device 410 may control the identification circuit 416 to at least temporarily stop the operation of outputting the interrupt signal related to associated with the external device to the application processor 415 in operation 615.

Further, if N or more (e.g., 30 or more) interrupt signals are generated for a predetermined time (e.g., 60 seconds) in the no-powered context (e.g., NO VBUS) through the power terminal 411a, the electronic device 410 may identify whether it is actually in the state of being physically attached (or connected) or detached from the external device 420 based on the voltage (e.g., VBUS voltage) of the power terminal 411a.

To that end, in operation 620, the electronic device 410 may identify whether the voltage for the VBUS (power terminal 411a) falls within a first designated range or a second designated range. If the voltage for the VBUS (power terminal 411a) falls within the second designated range, the electronic device 410 may maintain the state attached with the external device 420 in operation 625. For example, in a case where the voltage of the power terminal 411a falls within the second designated range (e.g., 4.75V or more or 5V or more), the identification circuit 416 may continuously detect the toggling-induced signal in a context where it is connected to the external device 420 and receives power through the power terminal 411a for charging the battery 419. In such a case, the identification circuit 416 may refrain from transferring the interrupt signal, indicating detection of a toggling-induced signal, to the processor 415. Accordingly, the processor 415 may recognize that attachment with the external device 420 is maintained for charging.

In contrast, if the voltage for the VBUS (power terminal 411a) falls within the first designated range, the electronic device 410 may recognize that it is in the state detached from the external device 420 and control to release the pause of the operation of outputting the interrupt signal in operation 630.

For example, in a case where the voltage of the power terminal 411a falls within the first designated range (e.g., post-full charge voltage or 0V), despite no connection to the external device 420, power for charging the battery 419 may not be supplied. Therefore, if determining that the voltage of the power terminal 411a is absent while temporarily restricting transfer of the interrupt signal to the processor 415 from the identification circuit 416, the processor 415 may recognize that charging is not needed and it is in the detached state. Further, after recognizing the detached state to disconnect from the external device 420, the identification circuit 416 may be restored into the original state. For example, it may release the pause of the operation of the identification circuit 416 outputting the interrupt signal related to associated with the external device 420 to the processor 415.

Figure 7:
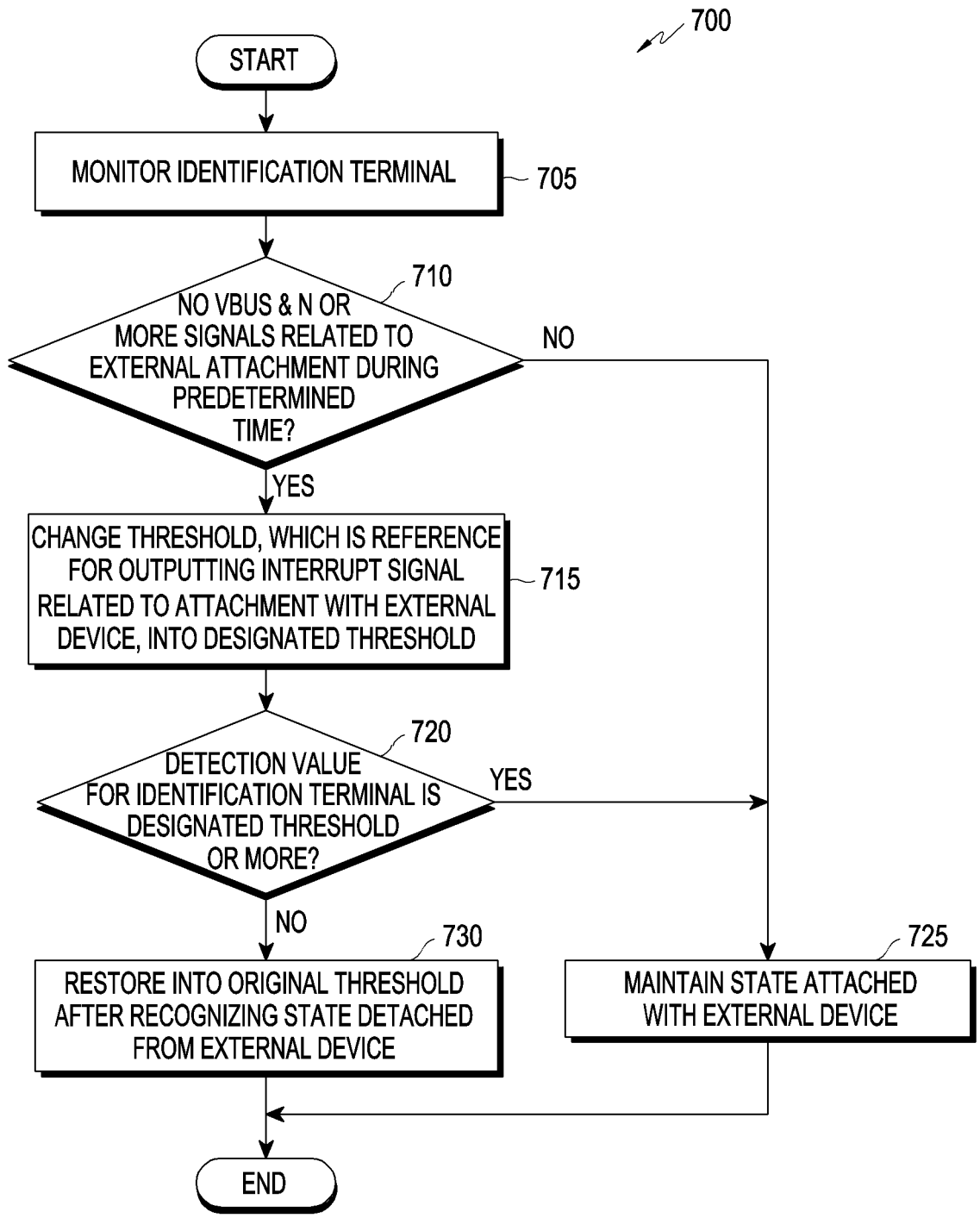
FIG. 7 is a flowchart illustrating operations of an electronic device operating as a source according to an embodiment of the disclosure.

FIG. 7 is a flowchart 700 illustrating operations of an electronic device operating as a source according to an embodiment of the disclosure.

Referring to FIG. 7, operations 705 and 710 of FIG. 7 are the same as operations 605 and 610 of FIG. 6, and no description thereof is repeated. However, in FIG. 7, it may be assumed that the electronic device 410 is a source device and is in the state attached with an external device 420 operating as a sink device.

Referring to FIG. 7, if N or more (e.g., 30 or more) interrupt signals are generated for a predetermined time (e.g., 60 seconds) in the no-powered context (e.g., NO VBUS) through the power terminal 411a, the electronic device 410 may change a threshold (e.g., about 80 uA), which is a reference for outputting the interrupt signal related to associated with the external device 420, into a designated threshold (e.g., about 180 uA or about 330 uA) in operation 715. For example, if the pull-up (Rp) resistance connected to the identification terminal 411b is changed from about 80 uA to about 180 uA or about 330 uA, the electronic device 410 may reidentify whether it is in the state attached with the external device 420 by measuring the current value due to Rp.

In operation 720, the electronic device 410 may identify whether the value detected for the identification terminal 411b is a designated threshold or more. If the value detected for the identification terminal 411b is the designated threshold or more, the interrupt signal is not transferred from the identification circuit 416 to the processor 415 and, thus, the electronic device 410 may maintain the state attached with the external device 420 in operation 725. For example, the electronic device 410 may identify the value detected for the identification terminal 411b and, if the detected value is the designated threshold or more (e.g., about 180 uA or about 330 uA), regard it as the state attached with the external device 420.

In contrast, unless the value detected for the identification terminal 411b is the designated threshold or more, the electronic device 410 may recognize the state detached from the external device 420 and then restore into the original threshold in operation 730. For example, the processor 415 may regard detection of a signal failing to meet the designated threshold as a wrong connector connection and recognize it as the detached state, so that the processor 415 may switch into sleep mode. In this case, the changed designated threshold (e.g., about 180 uA or about 330 uA) may be restored into the original threshold (e.g., about 80 uA).

Figure 8:
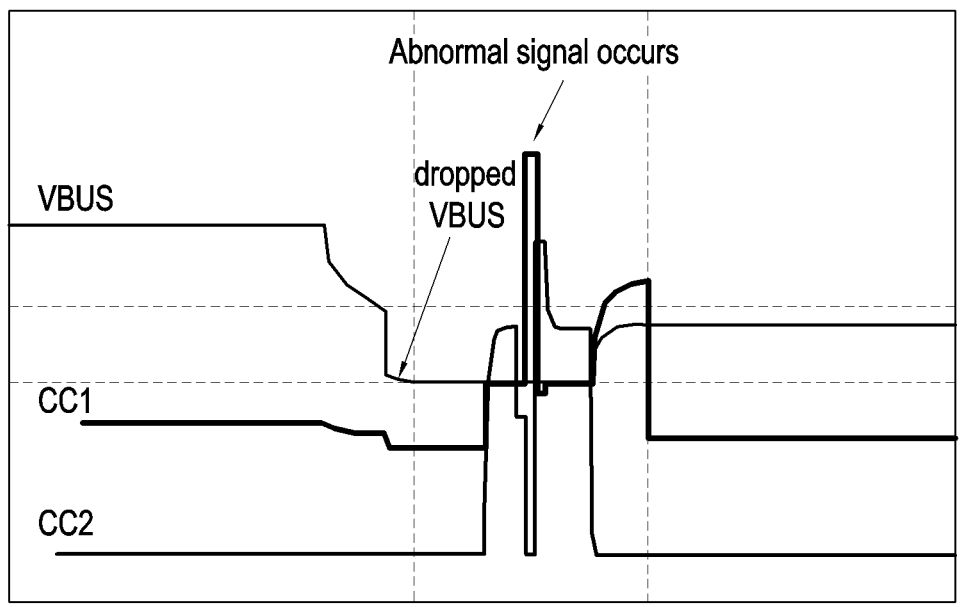
FIG. 8 is a view illustrating an operation waveform when attached with an external device according to an embodiment of the disclosure.

FIG. 8 is a view illustrating an operation waveform when attached with an external device according to an embodiment of the disclosure.

Referring to FIG. 8, it illustrates a case where as it is changed into the full charge state a designated time after starting to charge the battery 419 with the power supplied from the external device 420 through the power management circuit 414, the voltage for the power terminal 411a (VBUS) of the electronic device 410 is sharply dropped. In this case, since the electronic device 410 is being charged in the state attached with the external device 420, a high-level or low-level signal may be fixedly output through the CC1 terminal or CC2 terminal of the identification terminal 411b.

However, despite being in the state attached with the external device 420, if it is attached with an external device failing to meet the regulations defined in the USB power-related standard and is fully charged, a toggling-induced low or high signal may be detected as shown in FIG. 8. Accordingly, such an abnormal state may occur in which an abnormal signal (e.g., interrupt signal) related to attachment or detachment is frequently transferred to the processor 415. Thus, as the operations of recognizing the attached state and the detached state are repeated, the processor 415 may maintain the wake-up state due to the frequent interrupt signals without switching into the sleep state, causing quick discharging. Therefore, it is possible to further identify the attached state of a connector according to a specific condition to prevent a malfunction of the connector in an abnormal state in which a signal is repeatedly generated due to a change in connection state within a predetermined time although it is fully charged so that the voltage for the power terminal 411a (VBUS) is not detected as shown in FIG. 8.

This is described below with reference to FIG. 9.

Figure 9:
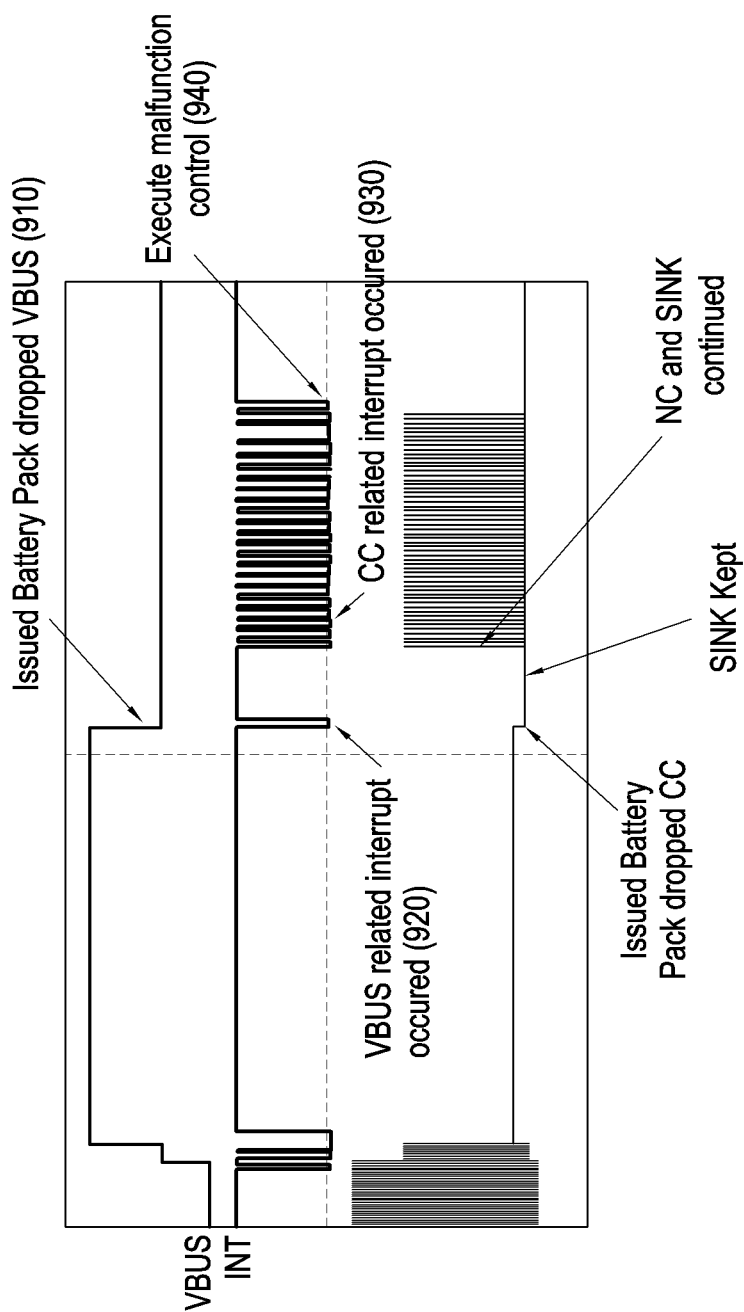
FIG. 9 is a view illustrating an operation waveform at least based on power and an attached state of an electronic device operating as a sink according to an embodiment of the disclosure.

FIG. 9 is a view illustrating an operation waveform at least based on power and an attached state of an electronic device operating as a sink according to an embodiment of the disclosure.

FIG. 9 exemplifies a waveform in which sink-connection repeats.

Referring to FIG. 9, a designated time after starting to charge the battery 419 with the power supplied from the external device 420 through the power management circuit 414, the voltage applied to the power terminal 411a may be identified. If the battery 419 reaches the fully charged state, no more power is supplied from the external device 420, so that the voltage detected for the power terminal 411a may be decreased. For example, if a VBUS drop occurs after fully charged by the battery pack (910), a VBUS-related interrupt 920 may occur in response to the full charge, and a signal (e.g., CC-related interrupt) 930 in which a low or high signal is repeated in relation to whether it is attached may continuously be repeated. However, according to various embodiments of the disclosure, in the abnormal state, the electronic device 410 may use not only the value for the identification terminal 411b but also the value for the power terminal 411a to additionally identify the connection state of the connector 411.

Accordingly, in an abnormal state in which the signal due to a change in connection state is repeatedly generated within a predetermined time, malfunction control may be executed (940) in connection with the connector. Although the voltage level of VBUS is output in a state of having dropped not to 0V but to an abnormal voltage level (e.g., 2.5V to 2.6V) due to the external device failing to meet the regulations defined in the USB power-related standard, the electronic device 410 operating as a sink controls not to generate a CC-related interrupt while malfunction control is executed. Thus, the processor 415 need not receive a malfunction-induced interrupt signal and may thus enter the sleep state, reducing current consumption. In other words, the processor 415 may control the identification circuit 416 to at least temporarily stop the operation of outputting the interrupt signal (CC-related interrupt) related to attachment with the external device to the processor 415.

At this time, if the voltage of the power terminal falls within the first designated range, e.g., if the voltage level of VBUS drops to 0V or less, the processor 415 may terminate the execution of the malfunction control by releasing the pause of the operation of the identification circuit 416 outputting the interrupt signal (CC-related interrupt) related to attachment with the external device to the processor 415. Here, if the voltage level of VBUS drops to 0V or less, it indicates that charging is not performed any longer, so that it may release the connection with the external device 420.

In contrast, if the voltage of the power terminal falls within the second designated range, e.g., if the voltage level of VBUS is increased to 4.75V or more, it indicates that charging is normally resumed, so that it may maintain the state attached with the external device 420.

Meanwhile, although the result of measurement of the voltage at the identification terminal and power terminal in relation to the connector of the electronic device 410 operating as a sink has been described above as an example, the result of measurement when it operates as a source is described with reference to FIGS. 10 and 11.

Figure 10:
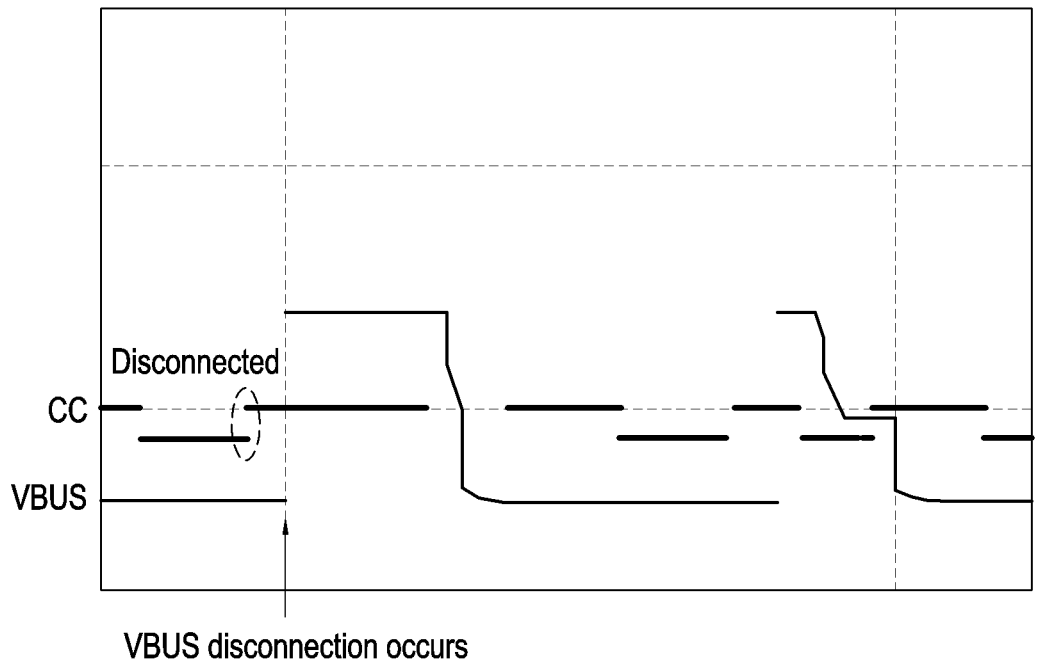
FIG. 10 is a view illustrating an operation waveform when attachment and detachment repeatedly occur according to an embodiment of the disclosure.

FIG. 10 is a view illustrating an operation waveform when attachment and detachment repeatedly occur according to an embodiment of the disclosure.

Figure 11:
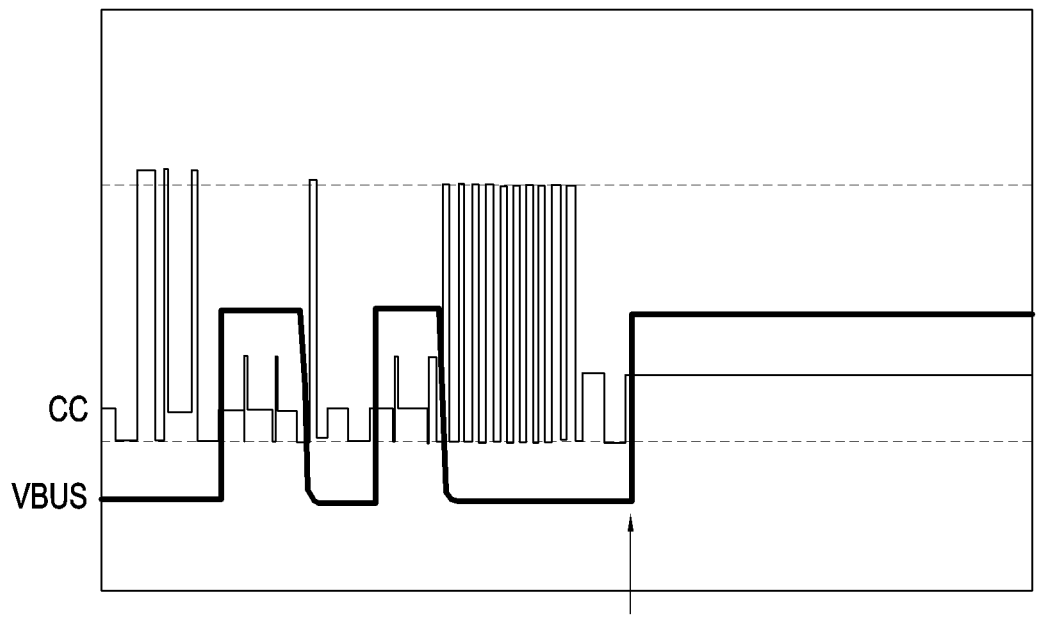
FIG. 11 is a view illustrating an operation waveform at least based on power and an attached state of an electronic device operating as a source according to an embodiment of the disclosure.

FIG. 11 is a view illustrating an operation waveform, at least, based on power and an attached state of an electronic device operating as a source according to an embodiment of the disclosure.

FIG. 10 exemplifies a waveform in which source disconnection repeats.

Referring to FIGS. 10 and 11, despite physical connection of the connector to the electronic device, toggling between a low voltage level and a high voltage level, rather than a constant voltage level, may repeat due to attachment of an external device that does not meet the regulations defined in the USB power-related standard or a foreign body introduced into the identification terminal. In the state of supplying power to the external device 420, the voltage of the power terminal 411a (VBUS) may be constantly detected as shown in FIG. 10. However, if the current is applied to the identification terminal 411b in the context where a foreign body is present, normal power supply to the external device 420 may be difficult. For example, if signal through the CC terminal is disconnected due to toggling, power supply through the power terminal 411a (VBUS) may also be disconnected. As such, if a detached state is detected through the identification terminal 411b while power is supplied through the power terminal 411a (VBUS), the processor 415 may stop application of voltage to the power terminal 411a (VBUS), so that VBUS disconnection may occur, and such waveform may repeat. However, according to various embodiments of the disclosure, the processor 415 may change the threshold in the identification circuit 416 to change the threshold, which is the reference for the identification circuit 416 to output the interrupt signal related to attachment with the external device 420 to the processor 415, into a designated threshold. For example, the processor 415 may increase the current value (or threshold) (e.g., about 80 uA) applied to the identification terminal 411b to the designated threshold (e.g., about 180 uA or about 330 uA).

Accordingly, if the current value (or threshold) (e.g., about 80 uA) applied to the identification terminal 411b is changed into a designated threshold (e.g., about 180 uA or about 330 uA), it may be connected to the source as shown in FIG. 11, and then, repeated toggling through the identification terminal 411b and resultant VBUS disconnection may be mitigated.

As the attachment or detachment malfunction prevention is executed as described above, the processor 415 may regard detection of a signal failing to meet the designated threshold as a wrong connector connection and recognize it as the detached state, so that the processor 415 may switch into sleep mode. As described above, the processor 415 may identify the presence or absence of a foreign body based on the value detected for the identification terminal 411b and, if a foreign body is present, enable normal power supply to the external device 420 by readjusting the threshold into the designated threshold.

The electronic device according to various embodiments may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic device is not limited to the above-listed embodiments.

It should be appreciated that various embodiments of the disclosure and the terms used therein are not intended to limit the technological features set forth herein to particular embodiments and include various changes, equivalents, or replacements for a corresponding embodiment. With regard to the description of the drawings, similar reference numerals may be used to refer to similar or related elements. It is to be understood that a singular form of a noun corresponding to an item may include one or more of the things, unless the relevant context clearly indicates otherwise. As used herein, each of such phrases as "A or B," "at least one of A and B," "at least one of A or B," "A, B, or C," "at least one of A, B, and C," and "at least one of A, B, or C," may include all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment of the disclosure, the module may be implemented in a form of an application-specific integrated circuit (ASIC).

Various embodiments as set forth herein may be implemented as software (e.g., the program 140) including one or more instructions that are stored in a storage medium (e.g., an internal memory 136 or an external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment of the disclosure, a method according to various embodiments of the disclosure may be included and provided in a computer program product. The computer program products may be traded as commodities between sellers and buyers. The computer program product may be distributed in the form of a machine-readable storage medium (e.g., a compact disc read only memory (CD-ROM)), or be distributed (e.g., downloaded or uploaded) online via an application store (e.g., Play Store™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments of the disclosure, each component (e.g., a module or a program) of the above-described components may include a single entity or multiple entities. Some of the plurality of entities may be separately disposed in different components. According to various embodiments of the disclosure, one or more of the above-described components may be omitted, or one or more other components may be added. Alternatively or additionally, a plurality of components (e.g., modules or programs) may be integrated into a single component. In such a case, according to various embodiments of the disclosure, the integrated component may still perform one or more functions of each of the plurality of components in the same or similar manner as they are performed by a corresponding one of the plurality of components before the integration. According to various embodiments of the disclosure, operations performed by the module, the program, or another component may be carried out sequentially, in parallel, repeatedly, or heuristically, or one or more of the operations may be executed in a different order or omitted, or one or more other operations may be added.

While the disclosure has been shown and described with reference to various embodiments thereof, it will be understood by those skilled in the art that various changes in form and details may be made therein without departing from the spirit and scope of the disclosure as defined by the appended claims and their equivalents.

What is claimed is:

1. An electronic device comprising:
   a connector including one or more signal terminals; and
   a control circuit electrically connected with the one or more signal terminals, wherein the control circuit is configured to:
      monitor attachment with an external device through an identification terminal among the one or more signal terminals,
      identify whether a designated number of, or more, monitoring signals related to attachment with the external device are detected during a designated time, and
      identify whether there is the attachment with the external device, based on a voltage of a power terminal among the one or more signal terminals, in response to the detection of the monitoring signals being identified.

2. The electronic device of claim 1, wherein the control circuit is configured further to:
   detect the voltage of the power terminal among the one or more signal terminals while monitoring; and
   identify whether the designated number of, or more, monitoring signals related to attachment with the external device are detected during the designated time, based on the detected voltage being absent.

3. The electronic device of claim 2, wherein the control circuit is configured further to:
   include an application processor, a power management circuit electrically connected with the power terminal among the one or more signal terminals, and an identification circuit electrically connected with the identification terminal among the one or more signal terminals; and
   based on the detection of the designated number of, or more, monitoring signals related to attachment with the external device during the designated time being identified through the identification circuit outputting the monitoring signals, at least temporarily stop outputting, by the identification circuit, an interrupt signal related to attachment with the external device to the application processor.

4. The electronic device of claim 3, wherein the control circuit is further configured to identify a state detached from the external device based on the voltage of the power terminal falling within a first designated range after the detection of the monitoring signals is identified.

5. The electronic device of claim 3, wherein the control circuit is further configured to release the stop of the output, by the identification circuit, of the interrupt signal related to the attachment with the external device to the application processor based on the voltage of the power terminal falling within a first designated range after the detection of the monitoring signals is identified.

6. The electronic device of claim 3, wherein the control circuit is further configured to identify a state attached with the external device based on the voltage of the power terminal falling within a second designated range after the detection of the monitoring signals is identified.

7. The electronic device of claim 3, wherein the control circuit is further configured to:
identify whether the external device is a device for supplying power to the electronic device or the external device is a device for receiving power from the electronic device through the identification terminal among the one or more signal terminals; and
supply a voltage, received from the external device through the power terminal, to the power management circuit to charge using part of the received voltage based on the external device being identified as the device for supplying the power.

8. The electronic device of claim 7, wherein the control circuit is further configured to, based on the external device being identified as the device for receiving the power from the electronic device:
in response to the detection of the designated number of, or more, monitoring signals related to attachment with the external device during the designated time being identified through the identification circuit, change a threshold, which is a reference for outputting, by the identification circuit, the interrupt signal related to the attachment with the external device to the application processor, into a designated threshold.

9. The electronic device of claim 8, wherein the control circuit is further configured to:
identify a detection value for the identification terminal after the detection of the monitoring signal is identified; and
identify whether there is the attachment with the external device by comparing the detection value with the designated threshold.

10. The electronic device of claim 1,
wherein the identification terminal includes a universal serial bus (USB) type-C-based CC1 terminal or CC2 terminal, and
wherein the power terminal includes a USB type-C-based VBUS terminal.

11. An electronic device comprising:
a connector including one or more signal terminals;
a control circuit electrically connected with the one or more signal terminals; and
at least one processor electrically connected with the control circuit, wherein the at least one processor is configured to:
monitor attachment with an external device through an identification terminal among the one or more signal terminals,
identify whether a designated number of, or more, monitoring signals related to attachment with the external device are detected during a designated time, and
in response to the detection of the monitoring signals being identified, allow the control circuit to change a voltage threshold of a power terminal among the one or more signal terminals, and
wherein the control circuit is configured to identify whether there is the attachment with the external device, based on a voltage of the power terminal.

12. A method for preventing a malfunction of a connector of an electronic device, the method comprising:
monitoring attachment with an external device through an identification terminal among one or more signal terminals included in the connector of the electronic device;
identifying whether a designated number of, or more, monitoring signals related to attachment with the external device are detected during a designated time; and
identifying whether there is the attachment with the external device, based on a voltage of a power terminal among the one or more signal terminals, in response to the designated number of the detection of, or more, the monitoring signals being identified.

13. The method of claim 12, wherein the identifying of whether the designated number of, or more, monitoring signals related to attachment with the external device are detected includes:
detecting the voltage of the power terminal among the one or more signal terminals while monitoring; and
identifying whether the designated number of, or more, monitoring signals related to attachment with the external device are detected during the designated time, based on the detected voltage being absent.

14. The method of claim 13, further comprising:
based on detection of the designated number of, or more, monitoring signals related to attachment with the external device during the designated time is identified through an identification circuit electrically connected with the identification terminal among the one or more signal terminals, at least temporarily stopping outputting, by the identification circuit, an interrupt signal related to attachment with the external device to an application processor of the electronic device.

15. The method of claim 14, wherein the identifying of whether there is the attachment with the external device includes identifying a state detached from the external device based on the voltage of the power terminal falling within a first designated range after the detection of the monitoring signals is identified.

16. The method of claim 14, further comprising:
releasing the stop of the output, by the identification circuit, of the interrupt signal related to the attachment with the external device to the application processor based on the voltage of the power terminal falling within a first designated range after the detection of the monitoring signals is identified.

17. The method of claim 14, wherein the identifying of whether there is the attachment with the external device includes identifying a state attached with the external device based on the voltage of the power terminal falling within a second designated range after the detection of the monitoring signals is identified.

18. The method of claim 14, further comprising:

identifying whether the external device is a device for supplying power to the electronic device or the external device is a device for receiving power from the electronic device through the identification terminal among the one or more signal terminals; and supplying a voltage, received from the external device through the power terminal, to a power management circuit electrically connected with the power terminal among the one or more signal terminals to charge using part of the received voltage based on the external device being identified as the device for supplying the power.

19. The method of claim 18, further comprising, based on the external device being identified as the device for receiving the power from the electronic device, in response to detection of the designated number of, or more, monitoring signals related to attachment with the external device during the designated time being identified through the identification circuit, changing a threshold, which is a reference for outputting, by the identification circuit, the interrupt signal related to the attachment with the external device to the application processor, into a designated threshold.

20. The method of claim 19, further comprising:

identifying a detection value for the identification terminal after the detection of the monitoring signal is identified; and identifying whether there is the attachment with the external device by comparing the detection value with the designated threshold.

* * * * *